United States Patent [19]

Kutz et al.

[11] Patent Number: 5,698,961
[45] Date of Patent: Dec. 16, 1997

[54] BATTERY ANALYZER/CONDITIONER SYSTEM AND METHOD OF USING SAME

[75] Inventors: Donald A. Kutz, Del Mar; Carl L. Gallenson; Philip J. DeSantis, both of San Diego, all of Calif.

[73] Assignee: HM Electronics, Inc., San Diego, Calif.

[21] Appl. No.: 527,418

[22] Filed: Sep. 13, 1995

[51] Int. Cl.$^6$ .................................................. H02J 7/00
[52] U.S. Cl. ........................................................ 320/15
[58] Field of Search ................................ 320/2, 5, 6, 15, 320/16

[56] References Cited

U.S. PATENT DOCUMENTS

| | | | |
|---|---|---|---|
| 5,039,929 | 8/1991 | Veistroffer et al. | 320/2 |
| 5,177,427 | 1/1993 | Bugaj | 320/20 |
| 5,315,253 | 5/1994 | Alexandres et al. | 324/429 |
| 5,349,281 | 9/1994 | Bugaj | 320/14 |
| 5,541,489 | 7/1996 | Dunstan | 320/2 |

OTHER PUBLICATIONS

Motorola Technical Summary for 8–Bit Microcontroller Unit MC68HC711K4, Motorola Inc., Nov. 1990.

*Primary Examiner*—Peter S. Wong
*Assistant Examiner*—Patrick B. Lau
*Attorney, Agent, or Firm*—Bernard L. Kleinke; Peter P. Scott

[57] ABSTRACT

The battery analyzer/conditioner system includes a battery analyzer/conditioner having an input port and an output port. The battery analyzer/conditioner operates to analyze, condition and test a group of rechargeable batteries. A cable is coupled between the input port and a remote control unit to transmit signals between the battery analyzer/conditioner and the remote control unit to enable the remote control unit to control the operation of the battery analyzer/conditioner. Another battery analyzer/conditioner also having an input port and an output port communicates with the battery analyzer/conditioner via a cable coupled between the output port of the battery analyzer/conditioner and the input port of the second battery analyzer/conditioner, wherein the first and second battery analyzer/conditioners are connected in a daisy chain network to permit the remote control unit to communicate selectively with any one of the battery analyzer/conditioner units.

22 Claims, 21 Drawing Sheets

REMOTE CONTROL UNIT

REMOTE CONTROL UNIT

MAIN UNIT

REMOTE CONTROL UNIT OPERATION OVERVIEW

POWER UP

BANK

VIEW

PROGRAM INITIALIZE

PROGRAM MENU

PROGRAM ANALYZE FINISH

PROGRAM CHARGE MA RATE

LOAD TEST

STORE STATION SETUP

RECALL SETUP

VALID NUMBER ENTRY

BATTERY ANALYZER/CONDITIONER SYSTEM AND METHOD OF USING SAME

TECHNICAL FIELD

The present invention relates in general to an improved battery analyzer/conditioner system, and a method of using it. The invention more particularly relates to a battery analyzer/conditioner system which can he operated remotely, and which is used according to a novel method.

BACKGROUND ART

Rechargeable batteries are well known for providing renewable energy sources that can he utilized in a large number of applications. Applications which require the continuous use of batteries as an energy supply, such as for portable communication devices, are especially suitable for use with rechargeable batteries as they will help to reduce the overall operating cost. In this regard, rechargeable batteries can he utilized repeatedly until the batteries can no longer maintain a sufficient energy level. By recharging the battery with conventional fast charging techniques, the rechargeable battery is ready for reuse in the application after a relatively short period of time.

Examples of conventional rechargeable batteries which are currently in wide use include nickel-cadmium (NiCd) batteries, nickel metal hydride (NiMH) batteries, lithium ion batteries and other batteries. Such rechargeable batteries maintain an acceptable energy level for relatively long periods of time and can he recharged with a battery charger in a relatively short time utilizing conventional fast charging techniques.

A side effect of repeated recharging of conventional rechargeable batteries may include in internal crystal growth or an increase in the internal impedance of the batteries. The increased impedance prevents a battery from holding a full charge, thereby reducing the capacity of the battery. In order to minimize the increased impedance suffered by rechargeable batteries, conventional battery analyzer/conditioners have been employed.

Battery analyzer/conditioner units perform many functions, including analyzing, conditioning and charging rechargeable batteries. In the analyzing mode, the condition of the rechargeable battery is determined as to whether or not it is defective. The conditioning mode helps to minimize the negative impact of the recharging process, by exercising the battery. In this regard, the battery is repeatedly charged and discharged according to a certain cycle of operation.

To safely charge a rechargeable battery, the unit charges a battery until an appropriate end of charge condition is indicated. U.S. Pat. Nos. 5,177,427 and 5,349,281 disclose such battery analyzer/conditioners, and are incorporated by reference as if fully set forth herein.

Although such battery analyzer/conditioner units are capable of analyzing, conditioning and charging up to five or six rechargeable batteries simultaneously, the cost of purchasing such a battery analyzer/conditioner unit is relatively expensive. In this regard, the battery analyzer/conditioner contains sophisticated displays and manual controls for performing the desired functions for the five or six rechargeable batteries simultaneously.

For certain users requiring more than five or six rechargeable batteries to be analyzed, conditioned or charged at one time, it has been necessary to purchase additional battery analyzer/conditioners. An operation that initially required only six rechargeable batteries to be analyzed, conditioned or charged at one time may subsequently require many more batteries to be maintained. To accommodate this increased need, additional battery analyzer/conditioners must be purchased, thereby increasing greatly the cost of the operation by the price of a new battery analyzer/conditioner. A large operation requiring many battery analyzer/conditioners to maintain a large number of rechargeable batteries could require a large expenditure of funds to meet such a demand.

Therefore, it would be highly desirable to have a new and improved battery analyzer/conditioner system which can maintain a large number of rechargeable batteries simultaneously, and which can be used in an efficient manner. Such a battery analyzer/conditioner system should be convenient to use and relatively inexpensive to purchase. Also, it would be desirable to be able to maintain such a large number of batteries by a single person in a convenient manner.

DISCLOSURE OF INVENTION

Therefore, the principal object of the present invention is to provide a new and improved battery analyzer/conditioner system and a method of using it, which can maintain a large number of rechargeable batteries simultaneously, wherein the system can be easily and conveniently used, and is relatively inexpensive to purchase.

Briefly, the above and further objects of the present invention are realized by providing a new and improved battery analyzer/conditioner system for maintaining a large number of rechargeable batteries simultaneously which is relatively inexpensive to purchase, and which can be used easily and conveniently according to a novel method.

The battery analyzer/conditioner system includes a battery analyzer/conditioner having an input port and an output port. The battery analyzer/conditioner operates to analyze, condition and test a group of rechargeable batteries. A cable is coupled between the input port and a remote control unit to transmit signals between the battery analyzer/conditioner and the remote control unit to enable the remote control unit to control the operation of the battery analyzer/conditioner. Another battery analyzer/conditioner also having an input port and an output port communicates with the battery analyzer/conditioner via a cable coupled between the output port of the battery analyzer/conditioner and the input port of the second battery analyzer/conditioner, wherein the first and second battery analyzer/conditioners are connected in a daisy chain network to permit the remote control unit to communicate selectively with any one of the battery analyzer/conditioner units.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein.

BEST MODE FOR CARRYING OUT THE INVENTION

The following description is presented and organized according to the following outline:

A. SYSTEM BLOCK DIAGRAM (FIG. 1)
A1. BUSS (FIG. 2)
A2. BATTERY ANALYZER/CONDITIONER MAIN UNIT (FIGS. 3 AND 4)
A3. REMOTE CONTROL UNIT (FIGS. 5 AND 6)
B1. REMOTE CONTROL UNIT SOFTWARE (FIG. 7)
B2. MAIN UNIT SOFTWARE (FIGS. 8–20)

A. SYSTEM BLOCK DIAGRAM (FIG. 1)

Figure 1:
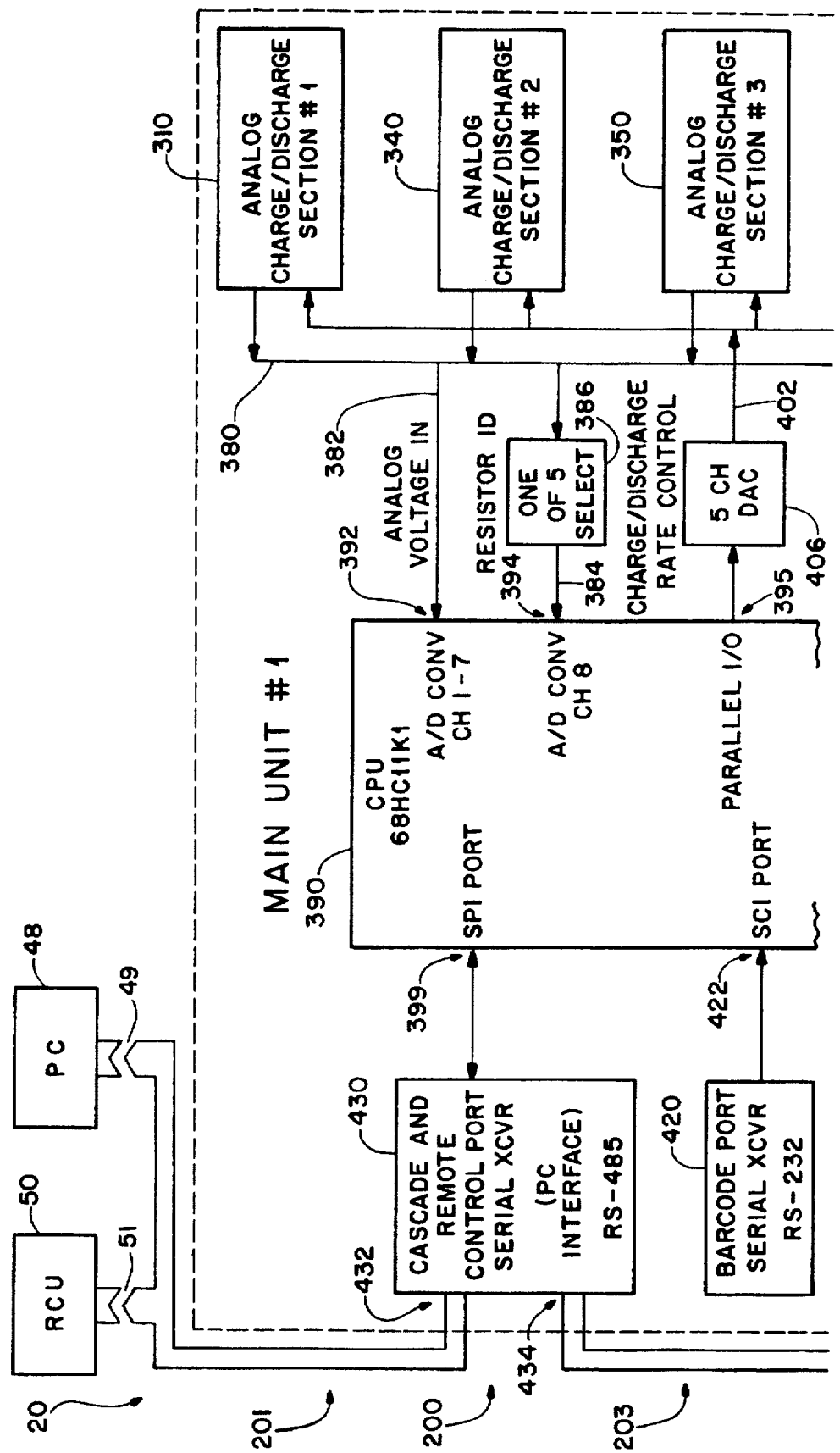
FIG. 1 is a block diagram of a battery analyzer/conditioner system, which is constructed in accordance with the present invention.

Referring now to the drawings, and more particularly to FIG. 1 thereof, there is shown a battery analyzer/conditioner system 10, which is constructed in accordance with the present invention. The system 10 can simultaneously maintain a number of rechargeable batteries (not shown) in an effective operating condition in an easy and convenient manner.

The system 10 generally comprises battery analyzer/conditioners or main units, such as main units 30, 40 and 45 for analyzing, conditioning and charging the batteries. Each one of the main units 30, 40 and 45 is capable of analyzing, conditioning and charging batteries independently of the other main units.

A buss 20 in the form of a plurality of cables is coupled to the main units 30, 40 and 45 to enable the main units 30, 40 and 45 to be linked in a daisy chain manner for facilitating communications therebetween.

A special purpose remote control unit 50 is coupled to the buss 20 by a jack 51 for enabling the control remotely of each one of the like main units 30, 40 and 45 individually. Alternatively, a general purpose computer 48 may be coupled to the buss 20 by a jack 49 to facilitate the remote control of the main units 30, 40 and 45. In a preferred form of the present invention, up to sixteen main units, such as main units 30, 40 and 45, can be coupled to the buss 20 and controlled by remote control unit 50. In other words, a like main unit (not shown) can be added to the system 10, by connecting it by a cable (not shown) to the last unit 45 on the network chain via a cable (not shown).

The remote control unit 50 has a primary link control capability to permit the remote control unit 50 to maintain a separate information transmitting ability or information receiving ability with each one of the main units 30, 40 and 45 coupled to the buss 20. Each main unit has a secondary link control capability for responding to, and receiving commands from, the remote control unit 50.

In operation, each one of the main units 30, 40 and 45 having batteries to be analyzed, conditioned or charged electrically connected thereto in a conventional manner. The batteries are analyzed, conditioned or charged by the individual main units 30, 40 and 45 according to the parameters stored by therein. A more detailed description of the analyzing, conditioning and charging of the batteries is provided in U.S. Pat. Nos. 5,177,427 and 5,349,281, which are incorporated herein by reference as if fully set forth herein.

The remote control unit 50 communicates with the main units 30, 40 and 45 via the buss 20 to determine the status of the analysis, conditioning or charging of the batteries. In addition, the remote control unit 50 permits the stored parameters to be adjusted remotely for the main units 30, 40 and 45, wherein the analysis, conditioning and charging of the batteries is revised according to the adjusted parameters.

Communications between the remote control unit 50 and the main units 30, 40 and 45 utilize an appropriate protocol for bidirectional message transfer with a high degree of error checking and correction.

Although the buss 20 is described and illustrated herein as a multiple buss, it will be understood by one skilled in the art that the communication between the remote control unit 50 and the main units 30, 40 and 45 could also be achieved with wireless transmission devices, such as radio frequency or infrared optical arrangements (not shown).

A1. BUSS (FIG. 2)

Figures 1, 2:
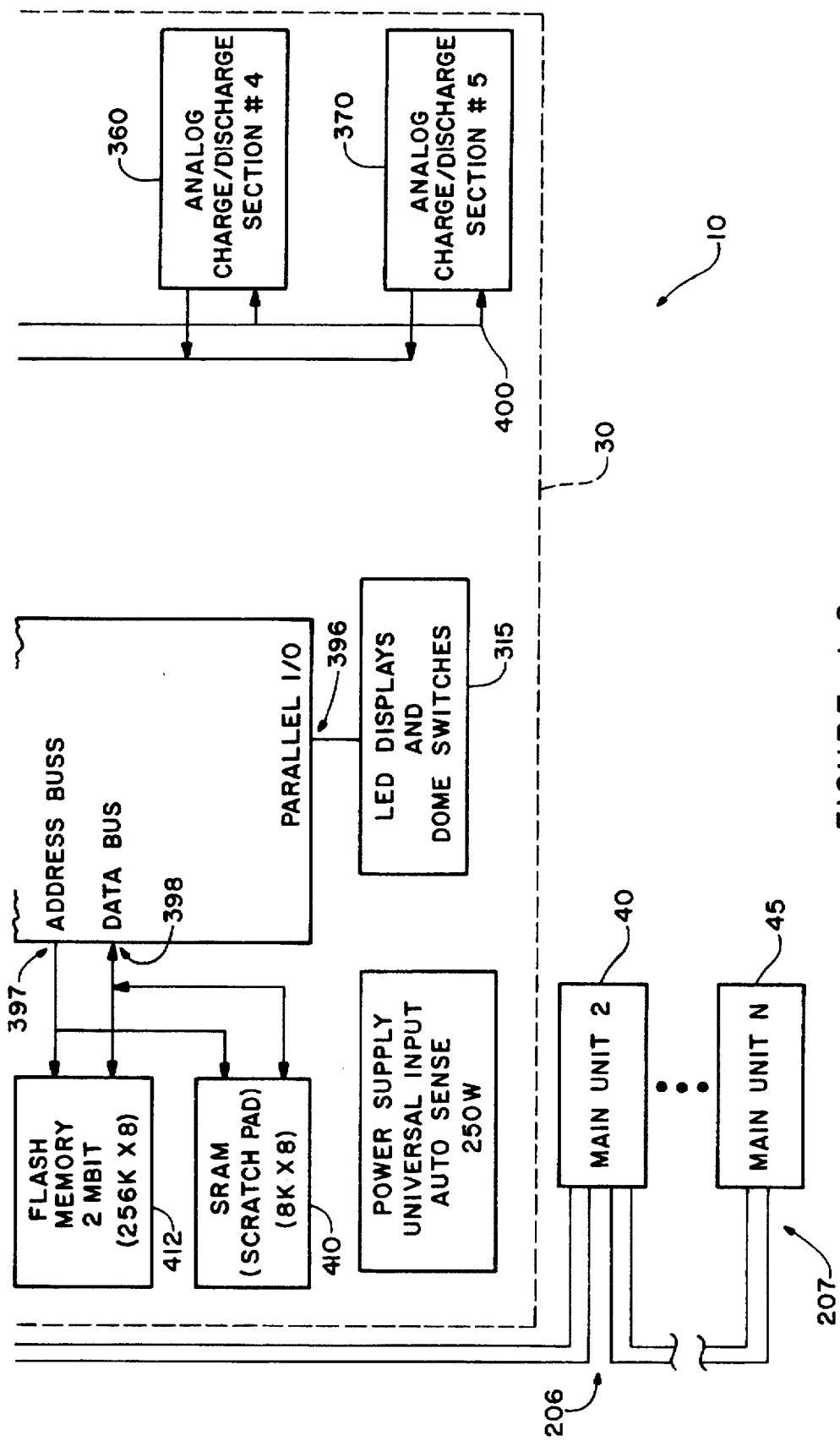
FIG. 2 is a diagrammatical view of a buss included in the system of FIG. 1.
Figure 2:
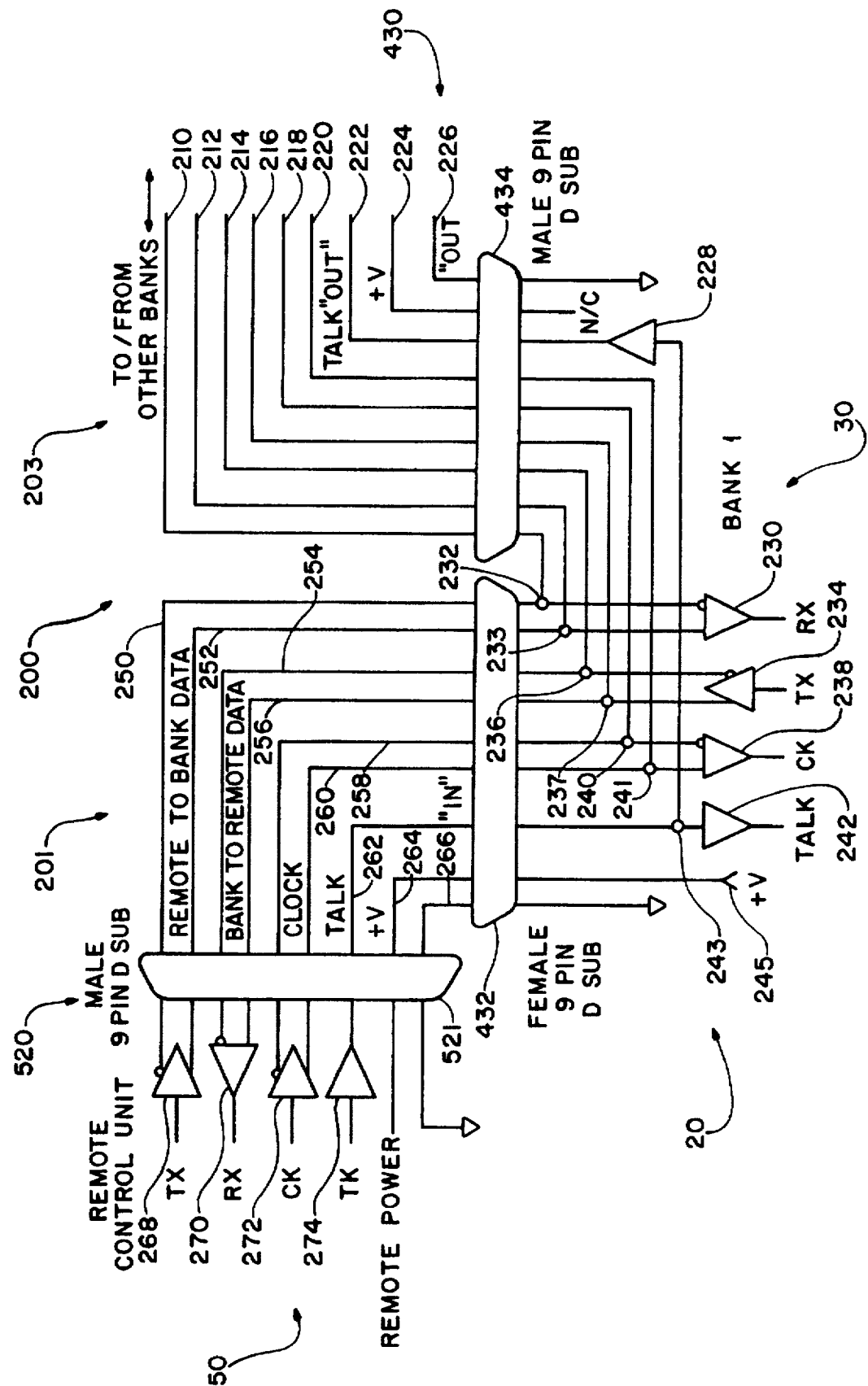

Considering now the construction of the buss 20 in greater detail with reference to FIGS. 1 and 2, the buss 20 defines a data link for facilitating data communication between the remote control unit 50 and the main units 30, 40 and 45. The buss 20 can function in a number of modes, including point-to-point, multi-point or two-way simultaneous communication between one or more of the main units 30, 40 and 45 and the remote control unit 50. The buss 20 enables the remote control unit 50 to transmit commands to, and receive responses from, the main units 30, 40 and 45.

The buss 20 includes connection points, such as connection points 200, 206 and 207 for coupling main units 30 and 40, respectively, to the buss 20. As the connection points, including connection points 200, 206 and 207 are substantially similar to one another, only connection point 200 will be considered hereinafter in greater detail.

The connection point 200 includes a buss portion 201 which couples the main unit 30 to the remote control unit 50. The connection point 200 further includes another buss portion or cable 203 for connecting the main unit 30 to the main unit 40 which is the next connected main unit in the daisy chain.

Connection point 207 is similar to connection points 205 and 206, except that connection point requires only one buss portion or cable to couple the main unit 45 to the buss 20. Main unit 45 is the last connection point on the buss 20, and thus, another buss portion or cable is not required unless additional main units are added after the main unit 45. A 120 ohm resistor (not shown) terminates the buss 20 at main unit 45.

Considering now the buss portions or cables 201 and 203 in greater detail with reference to FIG. 2, the buss portion or cable 203 includes conductors 210 and 212 for transmitting a transmit or TX signal from the remote control unit 50 to main units 40 and 45. Conductors 214 and 216 facilitate the communication of a receiving or RX signal from the main units 40 and 45 to the remote control unit 50. A clock signal CLOCK from the remote control unit 50 is transmitted by a pair of conductors 218 and 220 to the main units 40 and 45. A talk signal TALK is transmitted by a conductor 222 to facilitate communication between the remote control unit 50 and the main units 40 and 45. The buss portion or cable 203 further includes a voltage conductor 224 and a ground conductor 226. As described hereinafter in greater detail, voltage conductor 224 is not connected to main unit 30 as it has its own power supply.

Conductors 210, 212, 214, 216, 218, 220, 222 and 226 permit data to be communicated between the remote control unit 50 and the main units 40 and 45 via a cascade and remote control port serial transceiver 430, which will be described hereinafter in greater detail. The conductors 210, 212, 214, 216, 218, 220, 222, 224 and 226 engage the transceiver 430 via a male 9 pin connector 434. The conductor 210 is connected to a receiving buffer 230 at a node 232, and conductor 212 is connected to the receiving buffer 230 at a node 233. Similarly, conductor 214 is connected to a transmitting buffer 234 at a node 236 and conductor 216 is connected to the transmitting buffer 234 at a node 237. Conductors 218 and 220 are connected to a clock buffer 238 at nodes 240 and 241, respectively. The conductor 222 is connected to a talk buffer 242 at a node 243 via a buffer 228.

Each of the main units 30, 40 and 45 have their own power supply (not shown) for operating purposes. Therefore, there is no need to supply an operating voltage to main unit 30 from main unit 40. As a result, the connector 224 is not connected within the transceiver 430. To properly ground the buss portion 230, the conductor 226 is connected to ground.

Considering now the buss portion 201 in greater detail, the buss 201 includes a pair of conductors 250 and 252 for transmitting the transmit signal to the main units 30, 40 and 45, a pair of conductors 254 and 256 to receive the receiving signal from the main units 30, 40 and 45, a pair of clock conductors 258 and 260, and a talk conductor 262 to facilitate communication between the remote control unit 50 and the main units 30, 40 and 45.

The buss portion 201 further includes a voltage conductor 264 connected to a power supply 245 within the main unit 30 for providing power to the remote control unit 50. Unlike the main units 30, 40 and 45, the remote control unit 50 does not have its own power supply. Therefore, the remote control unit 50 must be supplied with power from a main unit, such as main unit 30. A ground conductor 266 is coupled between the main unit 30 and the remote control unit 50 to properly ground the buss portion 201.

The buss portion or cable 201 is coupled to the transceiver 430 via a female 9 pin connector 432, wherein the conductors 250, 252, 254, 256, 258, 260 and 262 are coupled to the receive buffer 230, the transmit buffer 234, the clock buffer 238 and the talk buffer 242, respectively, at the nodes 232, 233, 236, 237, 240, 241 and 243, respectively. In this way, the daisy-chained connection of the main units 30, 40 and 45 is facilitated.

In operation, communication via the buss 20 is accomplished utilizing three logical states: an Information Transfer State, an Initialized State, and a Logically Disconnected State. While in the Information Transfer State, a main unit, such as main unit 30, may transmit and receive information. All communications on the buss 20 observe the constraints of the Normal Response Mode, whereby the main unit 30 may initiate transmission of frames of information only as the result of receiving explicit permission to do so from the remote control unit 50. After receiving the permission, the main unit 30 can initiate a response transmission. The last frame of the response transmission will be explicitly indicated as such by the main unit 30. Following the indication of the last frame, the main unit 30 will stop transmitting until explicit permission is again received from the remote control unit 50.

In the Initialized State, all communications on the buss 20 observe the constraints of a system-defined procedure which causes each one of the main units 30, 40 and 45 to be assigned unique addresses.

While in the Logically Disconnected State, a main unit, such as main unit 30, is not considered to be connected to the buss 20, and is not permitted to transmit information. The main unit 30 can receive information, and may be addressed by the remote control unit 50 to move the main unit 30 to one of the other two states. The Logically Disconnected State is the normal state for the main unit 30 when the remote control unit 50 is communicating with another main unit, such as the main unit 40, or not communicating at all.

All transmissions on the buss 20 are in frames, and each frame conforms to the following structure:

F, A, C, Info, FCS

Where:

F=Flag sequence, used for frame synchronization

A=Address Field, the link level address of a main unit (2 octets)

C=Control Field, contains commands or responses (1–2 octets)

Info=Information Field, any number and sequence of bits

FCS=Frame Check Sequence, assures error free communications

Frames containing only data link control sequences form a special case where there is no information field. In this regard, the abbreviated frame structure is:

F, A, C, FCS

Data transmissions on the buss 20 are arranged such that for a given byte of information, the most significant bit (MSB) is transmitted first and the least significant bit (LSB) is transmitted last.

The conductors 250, 252, 254, 256, 258, 260, 262, 264 and 266 are coupled to the remote control unit 50 through a serial communication transceiver 520. A male 9 pin connector 521 enables the conductors 250, 252, 254, 256, 258, 260, 262, 264 and 266 to be easily coupled to the remote control unit 50. Within the remote control unit 50, the conductors 250 and 252 terminate at a transmit buffer 268, the conductors 254 and 256 terminate at a receive buffer 270, the conductors 258 and 260 terminate at a clock buffer 272, and the conductor 262 terminates at a talk buffer 274.

The conductor 264 supplying operating voltage +V to the remote unit 50 is connected to a power supply circuit (not shown) within the unit 50. The conductor 266 is connected to ground for properly grounding the buss 20.

BATTERY ANALYZER/CONDITIONER MAIN UNIT (FIGS. 1, 3 AND 4)

Figure 3:
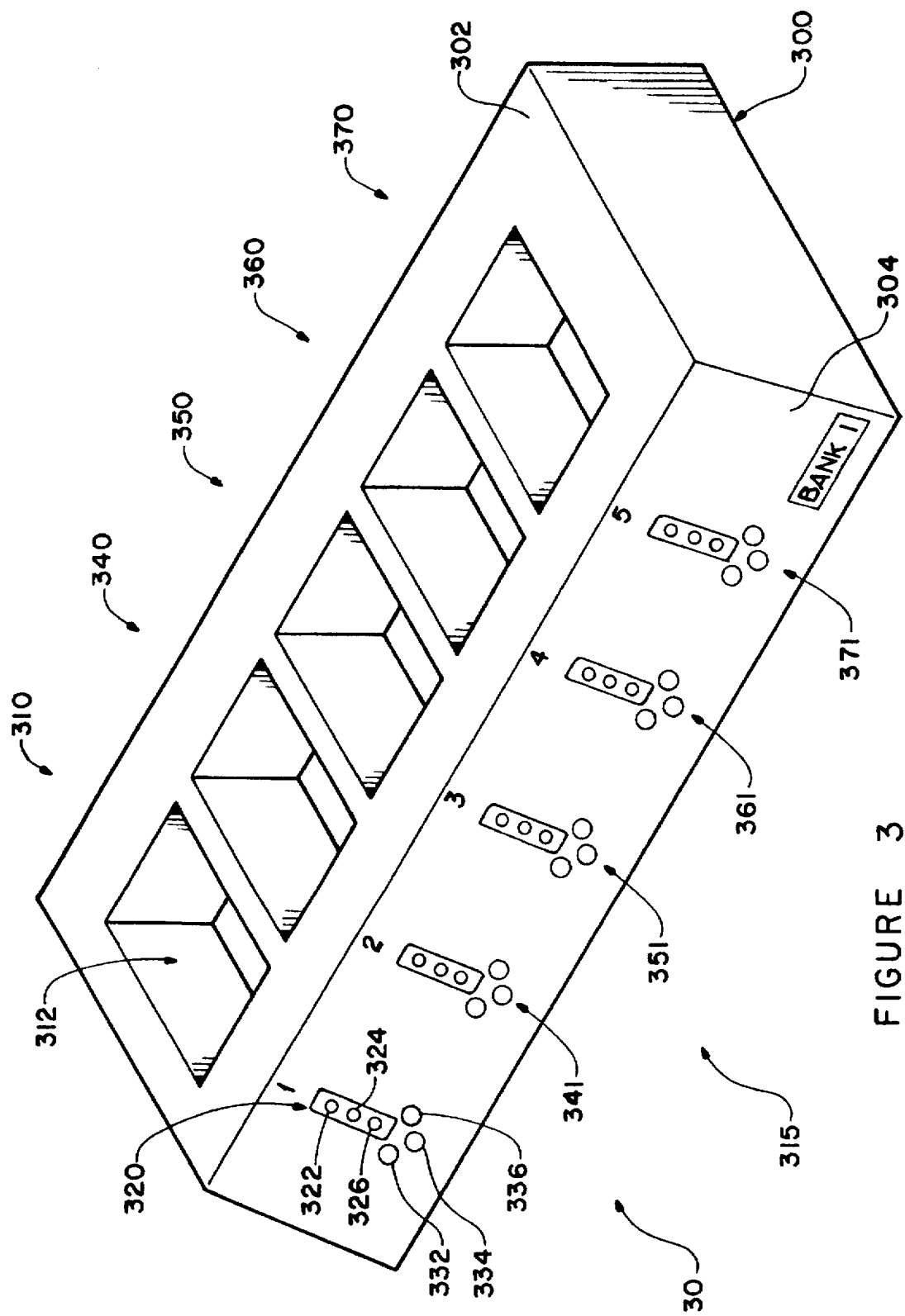
FIG. 3 is a perspective view of battery analyzer/conditioner included in the system of FIG. 1.
Figure 4:
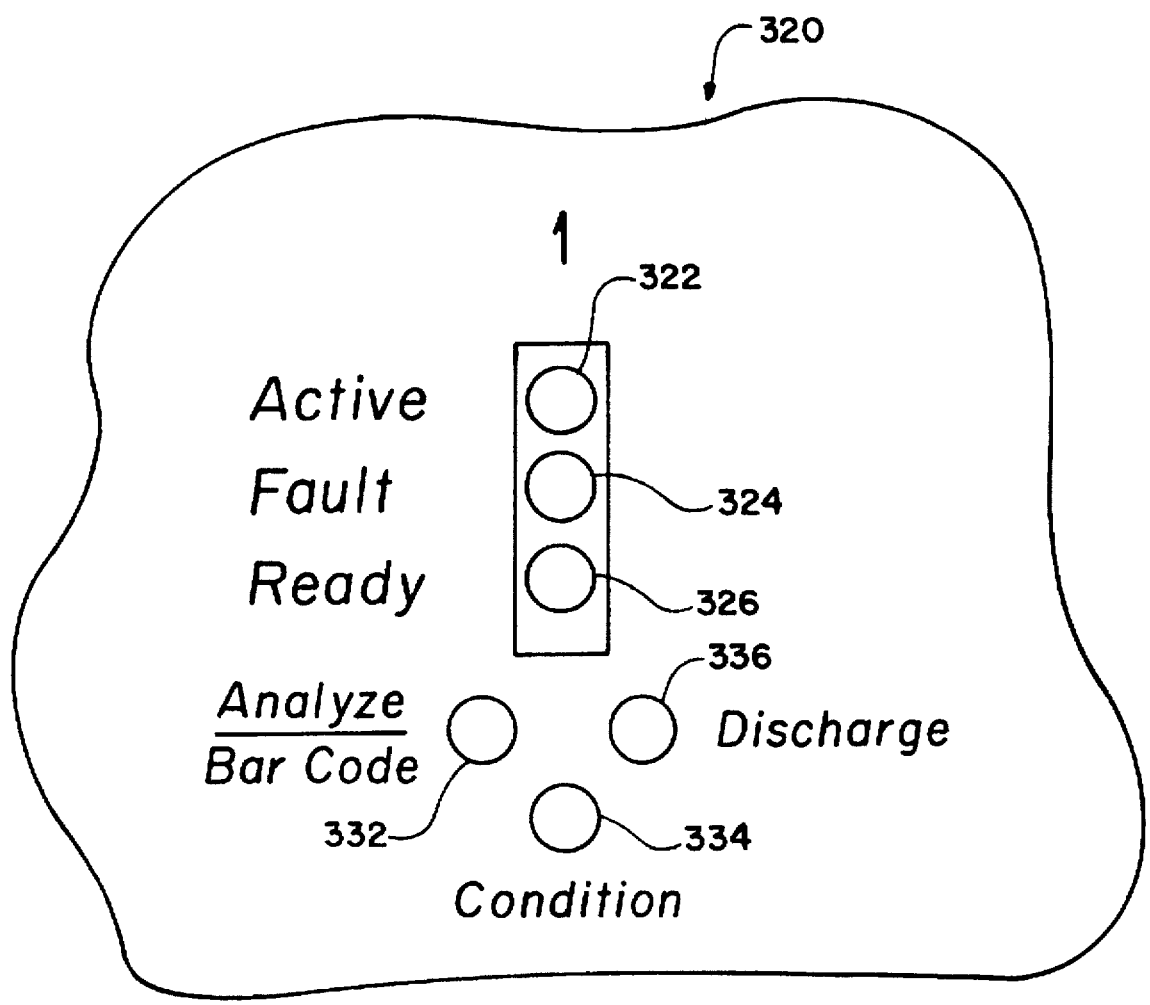
FIG. 4 is an enlarged fragmentary view of the battery analyzer/conditioner of FIG. 3.

Considering now the main units 30, 40 and 45 of the system 10 in greater detail with reference to FIGS. 1, 3 and 4, the main units 30, 40 and 45 are substantially similar. Therefore, only main unit 30 will be described hereinafter in greater detail.

Referring now to FIGS. 1 and 3, the main unit 30 includes a housing 300 having a top surface 302 and a sloped front surface 304. The main unit 30 further includes battery stations 310, 340, 350, 360 and 370 for analyzing, conditioning and charging the batteries. Each one of the battery stations 310, 340, 350, 360 and 370 has a battery receptacle, such as battery receptacle 312 of station 310, disposed within the top surface 302 to receive a rechargeable battery therein. An LED display and dome switch interface 315 is disposed on the front surface 304 to facilitate the operation of the main unit 30.

The interface 315 is coupled to the microprocessor or computer processor unit 390 at the parallel input/output port 396.

With reference to FIG. 1, the stations 310, 340, 350, 360 and 370 are coupled to one another by data lines 380 and 400. Data line 380 transmits analog information from stations 310, 340, 350, 360 and 370 to a microprocessor 390. Data is transferred from the data line 380 to the microprocessor 390 via conductors 382 and 384 connected to analog to digital converter ports 392 and 394, respectively. To facilitate the transmission of data to the microprocessor 390 from the stations 310, 340, 350, 360 and 370, a circuit 386 is disposed between the data line 380 and the input port 394 to multiplex signals from the stations 310, 340, 350, 360 and 370 to the port 394.

Data from the microprocessor 390 is transmitted from a parallel input/output port 395 to the data line 400 by a conductor 402. A five channel digital to analog converter 406 is disposed between the port 395 and the data line 400 to control the charge/discharge rate for each one of the stations 310, 340, 350, 360 and 370.

A scratch pad memory or SRAM 410 and a flash memory 412 are coupled to an address buss port 397 and a data buss port 398 of the microprocessor 390. The SRAM 410 stores temporary data. The flash memory 412 contains program code or instructions, and is used to store charge profile data which can be printed out with a printing device as desired. It also stores user entered parameters for charging, discharging, and analyzing purposes. A bar code port serial transceiver 420 is coupled to the microprocessor 390 at an SCI port 422 to enable the use of a bar code reader (not shown) can be coupled to the transceiver to identify a particular battery and its characteristics.

In operation, a battery is placed within the battery receptacle 312. The main unit 30 determines the battery type and capacity where a battery identification is available. The battery identification may include a resistor value, a mechanical differentiation, or a binary indicator. Parameters, such as battery charge rates, discharge rates, operating voltages, etc., are controlled by the battery identification. Thus, the main unit 30 is able to distinguish between the presence of a recognized battery identification, the presence of a non-recognized battery identification, and the absence of a battery identification, and can configure its parameters accordingly.

Considering now the LED displays and dome switches generally indicated in FIG. 3 at 315 to serve as a user interface, the interface 315 includes battery station displays 320, 341, 351, 361 and 371. As battery station interfaces 320, 341, 351, 361 and 371 are substantially similar, only battery station interface 320 will be considered in greater detail hereinafter.

As shown in FIG. 4, the battery station interface 320 includes light emitting diode (LED) devices 322, 324 and 326 to indicate the status of the battery station 310. In this regard, the LEDs 322, 324 and 326 indicate that the station 310 is active, that a fault condition exists, and that a battery in the battery station 310 is ready for charging, respectively.

The interface 320 further includes dome switches 332, 334 and 336 to control the operation of the main unit 30. In this regard, the dome switch 332 enables the analyze function of the main unit 30 to be initiated for the station 310. In addition, the dome switch 332 also functions to activate a bar code reader (not shown) when desired to initiate the bar code read function if an external bar code reader is employed. The dome switch 334 initiates the condition function while the dome switch 336 initiates the charge function of the main unit 30 for the battery station 310.

A3. REMOTE CONTROL UNIT (FIGS. 5 AND 6)

Figure 5:
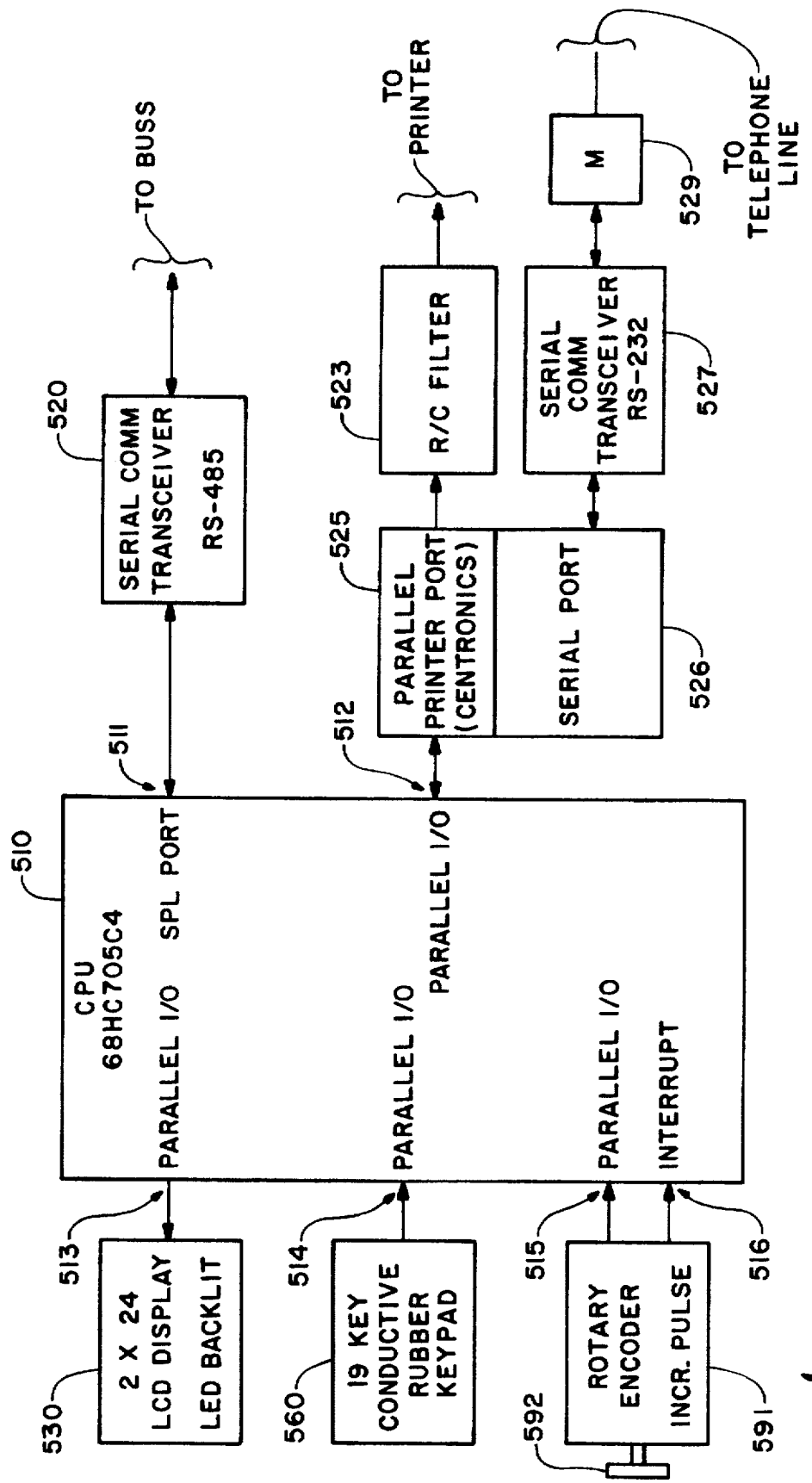
FIG. 5 is a block diagram of a remote control unit included in the system of FIG. 1.
Figure 6:
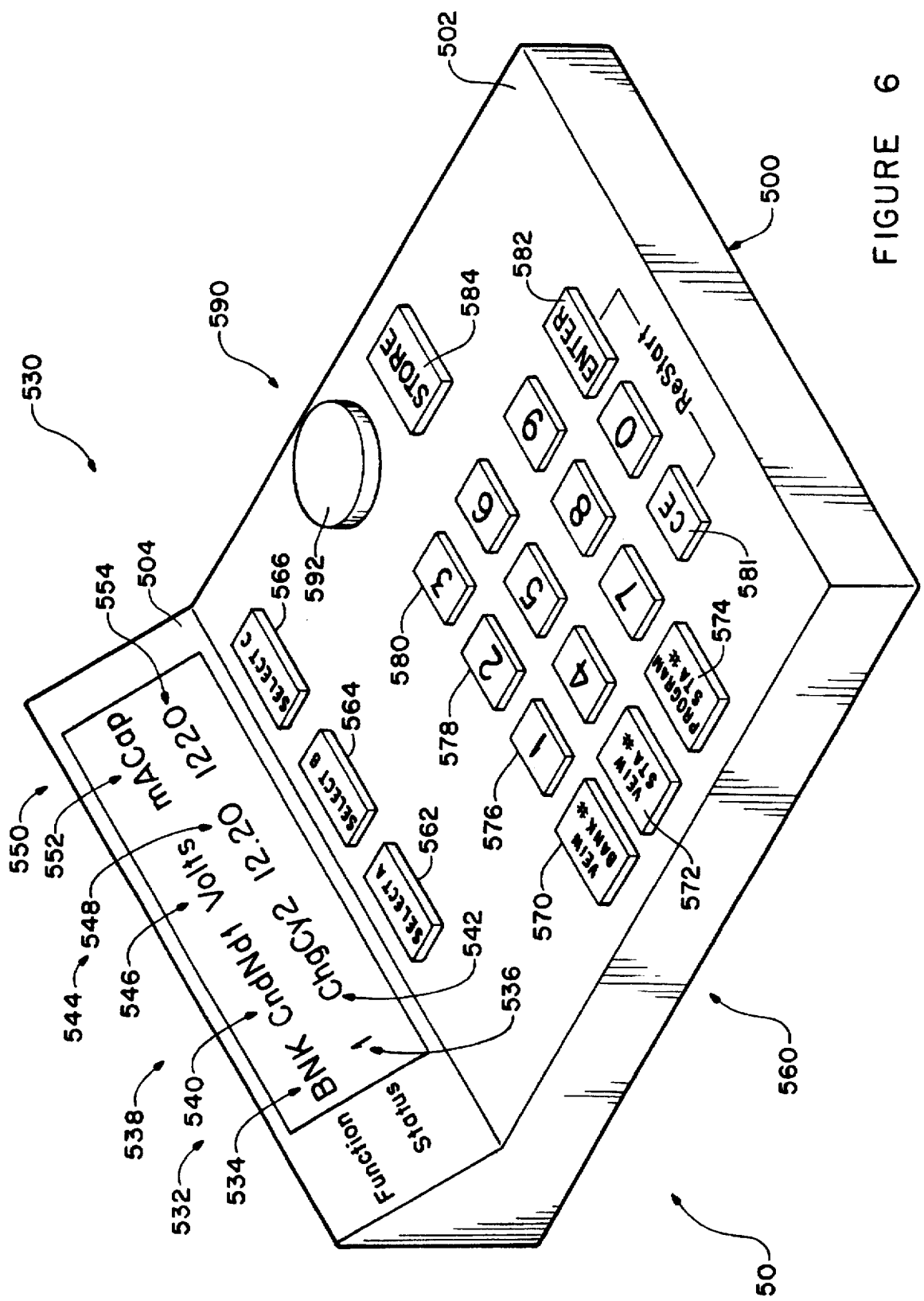
FIG. 6 is a perspective view of the remote control unit of FIG. 5.
Figure 7:
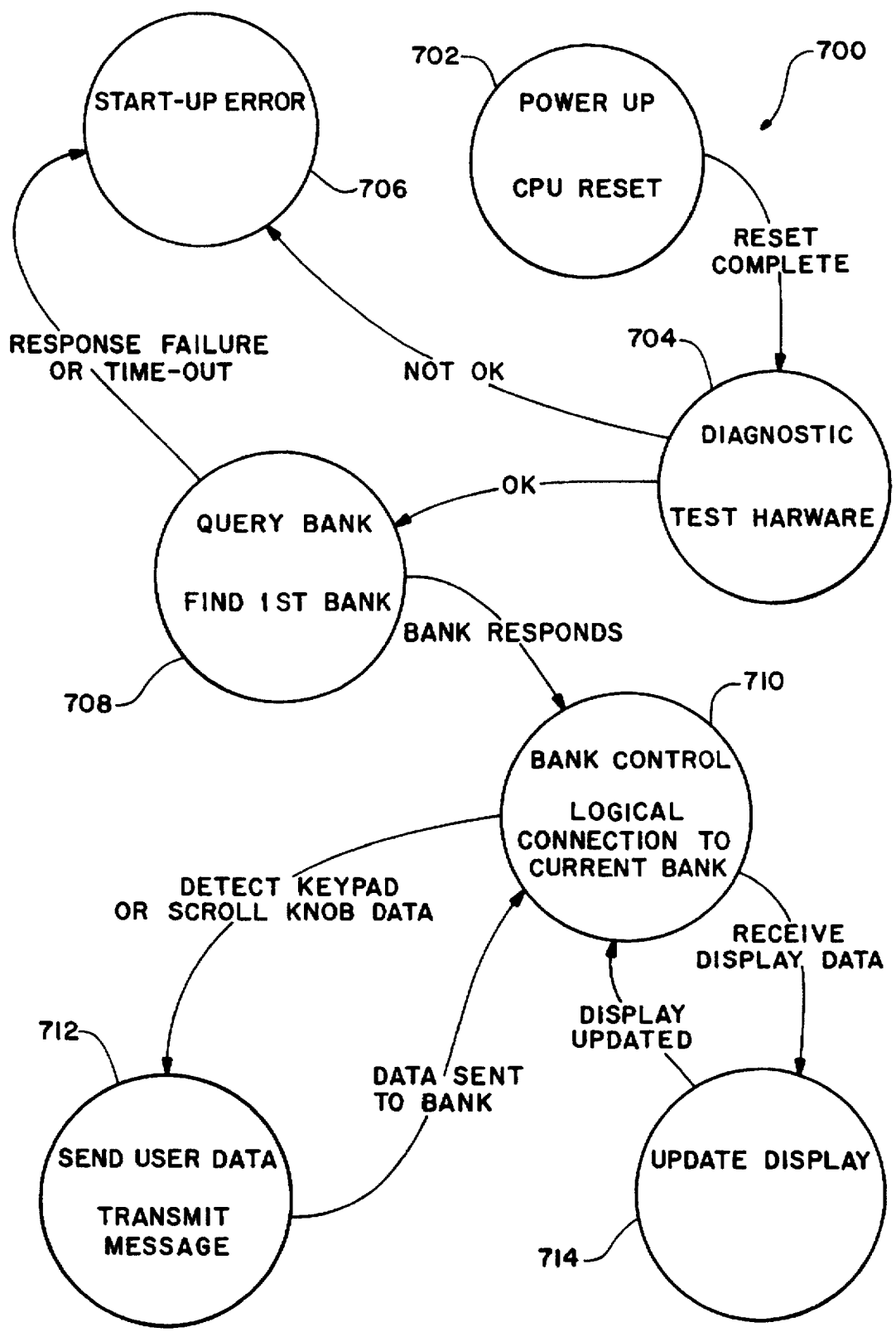
FIGS. 7–20 are state diagrams for software generally residing in the battery analyzer/conditioner of FIGS. 1, 3 and 4.

Referring now to FIGS. 5, 6 and 7, the remote control unit includes a housing 500 (FIG. 6), a top surface 502 and inclined surface 504 for facilitating the operation of the system 10. The remote control unit 50 is connected to the buss 20 by a serial communication transceiver 520 (FIG. 5).

The remote control unit 50 includes a microprocessor 510 coupled to the transceiver 520 at a Synchronous Peripheral Interface or SPI port 511. A two×24 LCD display 530 is disposed on the inclined surface 504, and is coupled to the microprocessor 510 by a parallel input/output port 513. The display 530 displays the mode of operation, battery status, battery volts, capacity and error messages relating to the batteries being analyzed or conditioned by a main unit, such as main unit 30.

A nineteen key conductive rubber keypad 560 is disposed in the top surface 502 for data entry and control functions. The keypad 560 is coupled to the microprocessor 510 via a parallel input/output port 514. A rotary control 590 is coupled to the microprocessor 510 via a parallel input/output port 515 and an interrupt port 516 to enable a user to scroll through available menu fields of parameter values as displayed on the display 530. The rotary control 590 includes a rotary encoder 591 connected to a rotary knob 592 which projects up from the top surface 502.

A printer (not shown) is coupled to a parallel input/output port 512 of the microprocessor 510 via an R/C filter 523 and a parallel printer port (Centronics) 525. A serial port 526 coupled to the parallel printer port 525 enables a serial communication transceiver 527 to transmit data over telephone lines via a modem 529.

Considering now the LCD display 530 in greater detail with reference to FIG. 6, the display 530 is divided into four quadrants or fields 532, 538, 544 and 550 for displaying information therein. Each one of the fields 532, 538, 544 and 550 are further divided into upper fields 534, 540, 546 and 552, respectively, and into lower fields 536, 542, 548 and 554, respectively. The upper fields 534, 540, 546 and 552 depict various battery charge, maintenance and reporting functions that are available for viewing or for changing. The lower fields, 536, 542, 548 and 554 depict various status values corresponding to the respective upper fields 534, 540, 546 and 552.

The keypad 560 includes select keys, such as select A key 562, select B key 564, and select C key 566. The keypad 560 further includes a view bank key 570, a view station 572, and a program station key 574. The keys 570, 572 and 574 facilitate a bank operation, a view operation, and a program operation, respectively.

The keypad 560 further includes a plurality of keys representative of the numbers 1–9 and 0, such as keys 576, 578 and 580 representative of the numbers 1, 2 and 3, respectively. A clear key 581 enables information to be revised. An enter key 582 enables information entered by the user to be processed by the microprocessor 510. A store key 584 enables an activity, or the values for a program function, to be set for use by the remote control unit 50.

Examples of the bank operation, the view operation and the program operation are described below. The bank operation enables the user to select a main unit, such as the main unit 30, also known as a bank, to determine the general status of each battery received in the battery stations of that particular bank. To determine the status of each battery installed in the main unit 30 (bank 1), the view bank key 570 is depressed. The number identifying the bank, in this case the number 1, is entered by depressing the key 576. Finally, the enter key 582 is depressed to signal the end of an input sequence.

In response the LCD display 530 indicates the status of each of the battery stations 310, 340, 350, 360 and 370 of main unit 30, wherein the stations 310, 340, 350, 360 and 370 are designated as stations 1–5, respectively, on the display 530. In this regard, the field 532 will indicate the bank unit selected. The field 538 will display the stations which are presently active and the field 544 will display the stations currently experience a fault condition and field 550 will display the stations which are in a ready state.

The view operation permits the user to obtain a station specific view of any battery maintenance and charging operations that are in process at a selected main unit, such as main unit 30.

To initiate the view operation, the view station key 572 is depressed followed by the number which identifies the battery station which is to be viewed during a charge or maintenance process. Thus, to view the station 340 (station 2) of the main unit 30, the key 578 is depressed following the view station key 572. The operation is set in motion by depressing the enter key 582.

The LCD display 530 indicates the functions and corresponding values for the charging or maintenance process that is currently under way at station 340 (station 2). The field 532 will alternate between displaying the associated bank number and the selected station number. Additional performance parameters may be viewed by pressing the select A key 562, the select B key 564 or the select C key 566.

The program operation permits the user to view or change individual battery station parameters that are set to charge, discharge, test and print at the desired battery stations, such as battery station 340. The program operation will permit the parameters to be viewed, but not changed, if a battery is installed in the selected station.

The program operation is initiated by pressing the program key 574 followed by pressing a numbered key, such as keys 576, 578 and 580, identifying the battery station or stations which are to be controlled or programmed. Depressing the enter key 582 completes the operation.

As in the view operation described above, the field 532 will alternately display the bank number and the station number currently being interrogated. The field 538 displays the menu of control and program items that are currently set or available for change wherein the upper field 540 will be highlighted to indicate that it is the primary display item. The fields 544 and 550 indicate the functions and corresponding values that are currently set for the program or control menu items for the selected bank and battery station or stations.

B1. REMOTE CONTROL UNIT SOFTWARE (FIG. 7)

Referring to FIG. 7, there is shown a summary state diagram 700 for the remote control unit 50. Although the software for operating the system 10 generally resides in the main units, such as main unit 30, the remote control unit 50 includes software for enabling it to interface with the main units 30, 40 and 45.

Initially, the remote control unit 50 is powered up at block 702, wherein the microprocessor 510 is reset. Upon the completion of the reset function, a diagnostic test is performed at block 704. In the event that the diagnostic test at block 704 determines there is an error, a start-up error indication is provided at block 706.

Where the diagnostic test of block 704 returns a positive result, an interrogation is performed at block 708 to determine the first main unit or bank on the buss 20. Upon receipt of a response from a bank, a logical connection between the remote control unit 50 and the bank is made at block 710.

If no response is received from a bank within a specified period of time, a start up error is indicated at block 706.

User information input into the remote control unit 50 via the keys 560 or rotary control 590 (FIG. 5) causes the remote control unit 50 to transmit the user data to the main unit 30 at block 712. Once the user data is transmitted, the remote control unit 50 returns to the logical connection state at block 710.

Parameter information is received from the main unit 30 in response to the user data transmitted by the remote control unit 50. The display of the received parameter information is updated at block 714, and the remote control unit 50 returns to the logical connection state at block 710 for further operation as required.

B2. MAIN UNIT SOFTWARE (FIG. 8–20)

Figure 8:
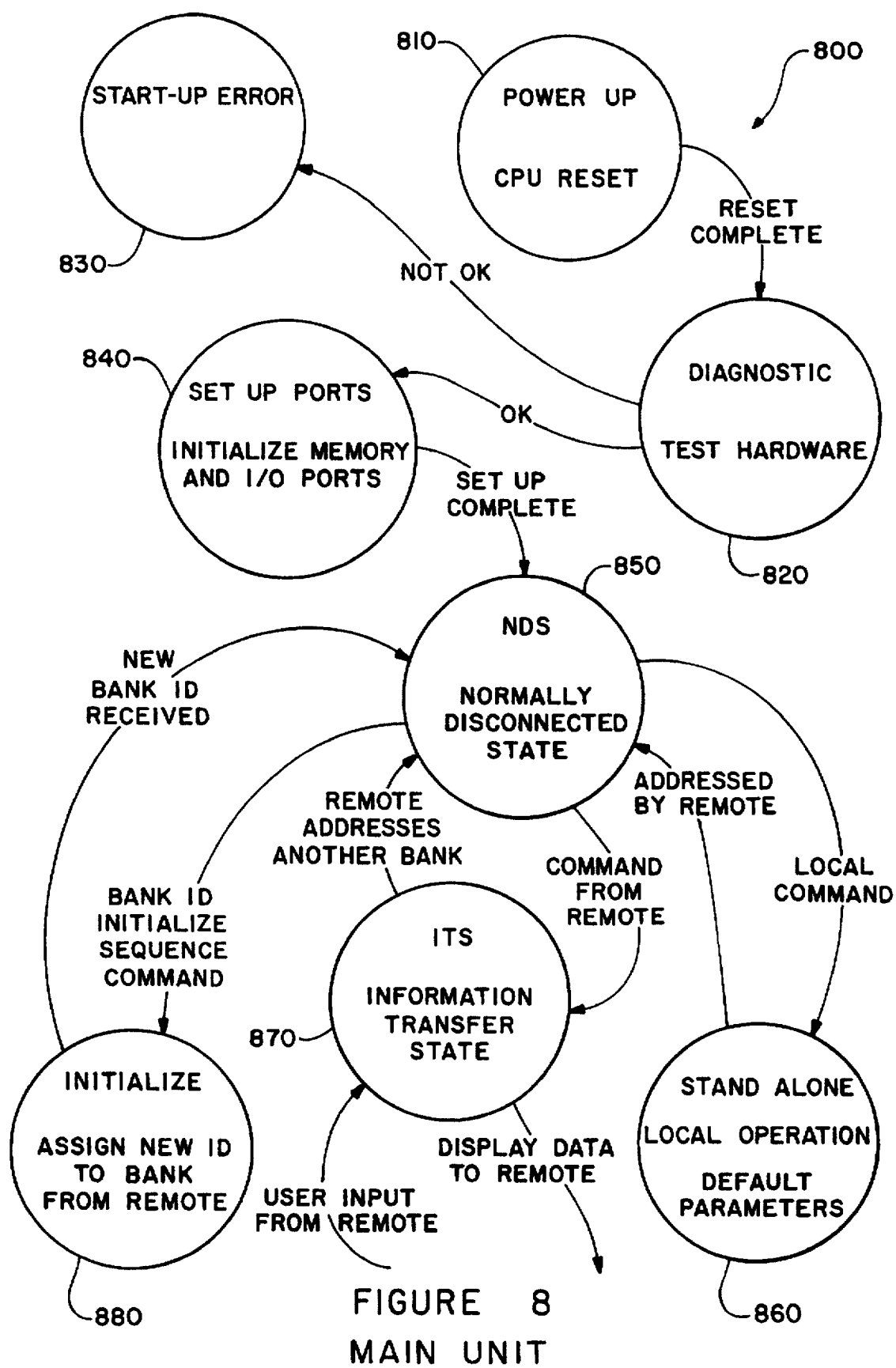

Referring now to FIG. 8, there is shown a summary state diagram 800 for the main unit 30. The main unit 30 is initially powered up at block 810, wherein the microprocessor 390 (FIG. 1) is reset. After the microprocessor 390 has been reset, a diagnostic test is performed on the main unit 30 hardware at block 820. If the resulting diagnostic test discovers an error, a start-up error condition is identified at block 830.

Where the diagnostic test at block 820 indicates that the main unit 30 is functioning properly, the memory and input/output ports are initialized at block 840. The main unit 30 then enters the Normally Disconnected State at block 850 after the initialization is complete.

From the Normally Disconnected State at block 850, the main unit 30 can operate as a stand alone unit utilizing default parameters stored therein at block 860. In this regard, local commands are entered via the interface 315 (FIG. 3). Operation of the main unit 30 is returned to the Normally Disconnected State at 850 upon being addressed by the remote control unit 50.

The main unit 30, upon the receipt of a command from the remote control unit 50, will enter the Information Transfer State at block 870 from the Normally Disconnected State at block 850. In the Information Transfer State at block 870, the main unit 30 can receive input from the remote control unit 50 and can transmit display data from the main unit 30 to the remote control unit 50. The transfer of information continues until another main unit is addressed, thereby returning the main unit 30 to the Normally Disconnected State at block 850.

The main unit 30 is assigned a new identification number by the remote control unit 50 at block 880. After receiving a new identification number for the main unit 30, the operation of the main unit 30 returns to the Normally Disconnected State at block 850 until receiving further information from the remote control unit 50.

Figure 9:
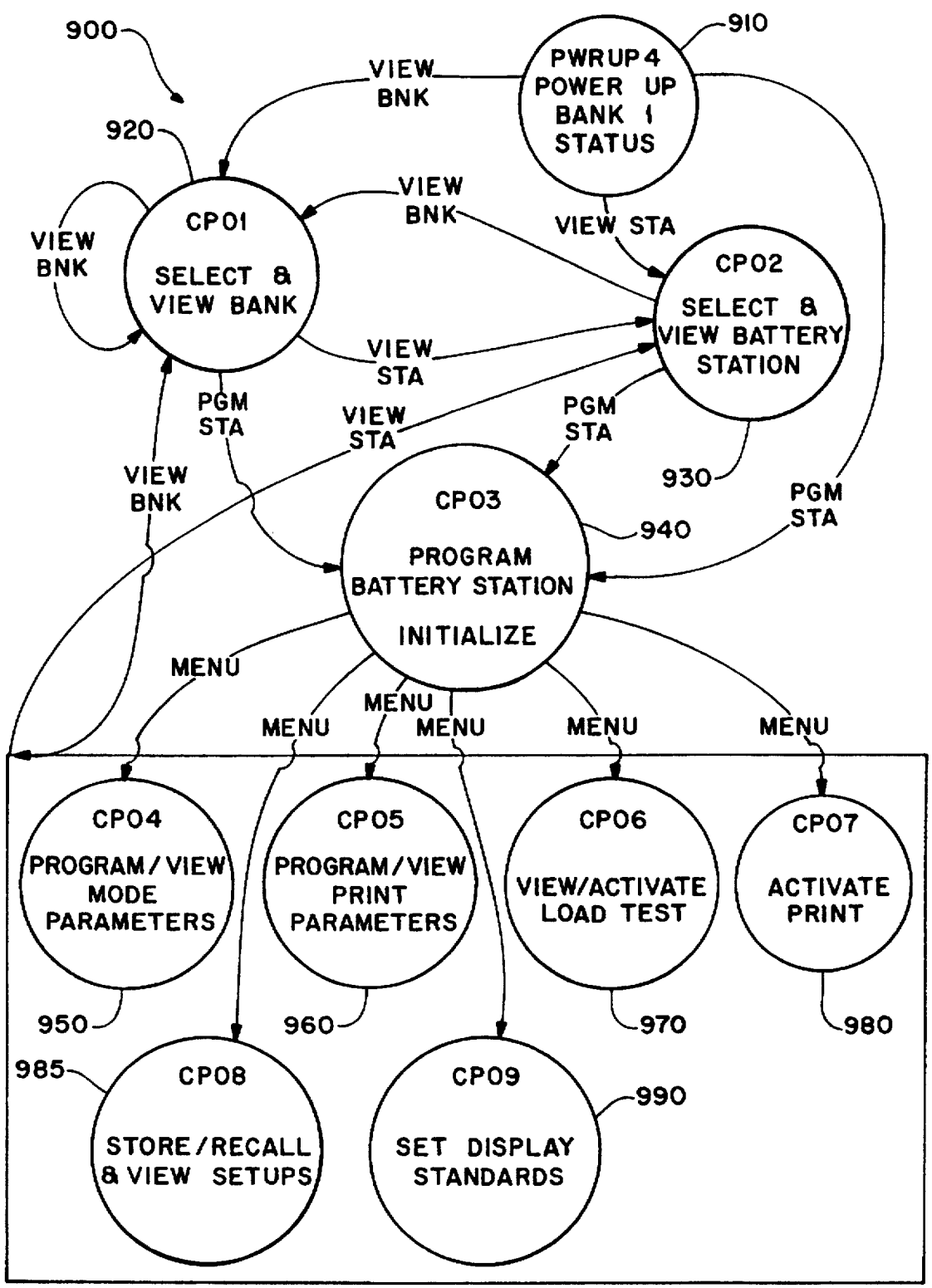

Referring now to FIG. 9, there is shown a remote control unit operation overview state diagram 900. The state diagram 900 illustrates the control of the system 10 as performed via the remote control unit 50.

The remote control unit 50 is initially powered up at block 910, wherein the status of the first available main unit is displayed at the remote control unit 50. From block 910, a view bank function, a view station function, or a program station function may be selected. Where the view bank function is selected by depressing the view bank key 570 (FIG. 6), a desired bank can be selected for viewing at block 920. The view bank function can be selected again to view another bank at block 920.

The view station function may be selected from block 920 to select and view a desired battery station at block 930. From block 930, the view bank function may be selected again to select and view another bank at block 920. Alternatively, the program station function may be selected from block 930 by depressing the program station key 574 (FIG. 6) to enable a battery station to be initialized and programmed at block 940.

The program station function may also be selected from block 920 to enable a battery station to be programmed at block 940. Similarly, the program station function may be selected directly from the power up block 910, as described previously, thereby enabling the remote control unit 50 to program a battery station at block 940.

From the battery station program block 940, the user is presented with a number of menu choices from which to select on the display 530 (FIG. 6). In this regard, mode parameters may be programmed or viewed at block 950. Print parameters may be programmed or viewed at block 960. A load test may be viewed or activated at block 970. Stored print parameters may be used to activate a printer (not shown) at block 980. Desired analyzing/conditioning set ups for controlling the operation of the main units 30, 40 and 45 may be stored, recalled and viewed at block 985. Additionally, the display standards for viewing information on the display 530 (FIG. 6) may be set at block 990.

Figure 10:
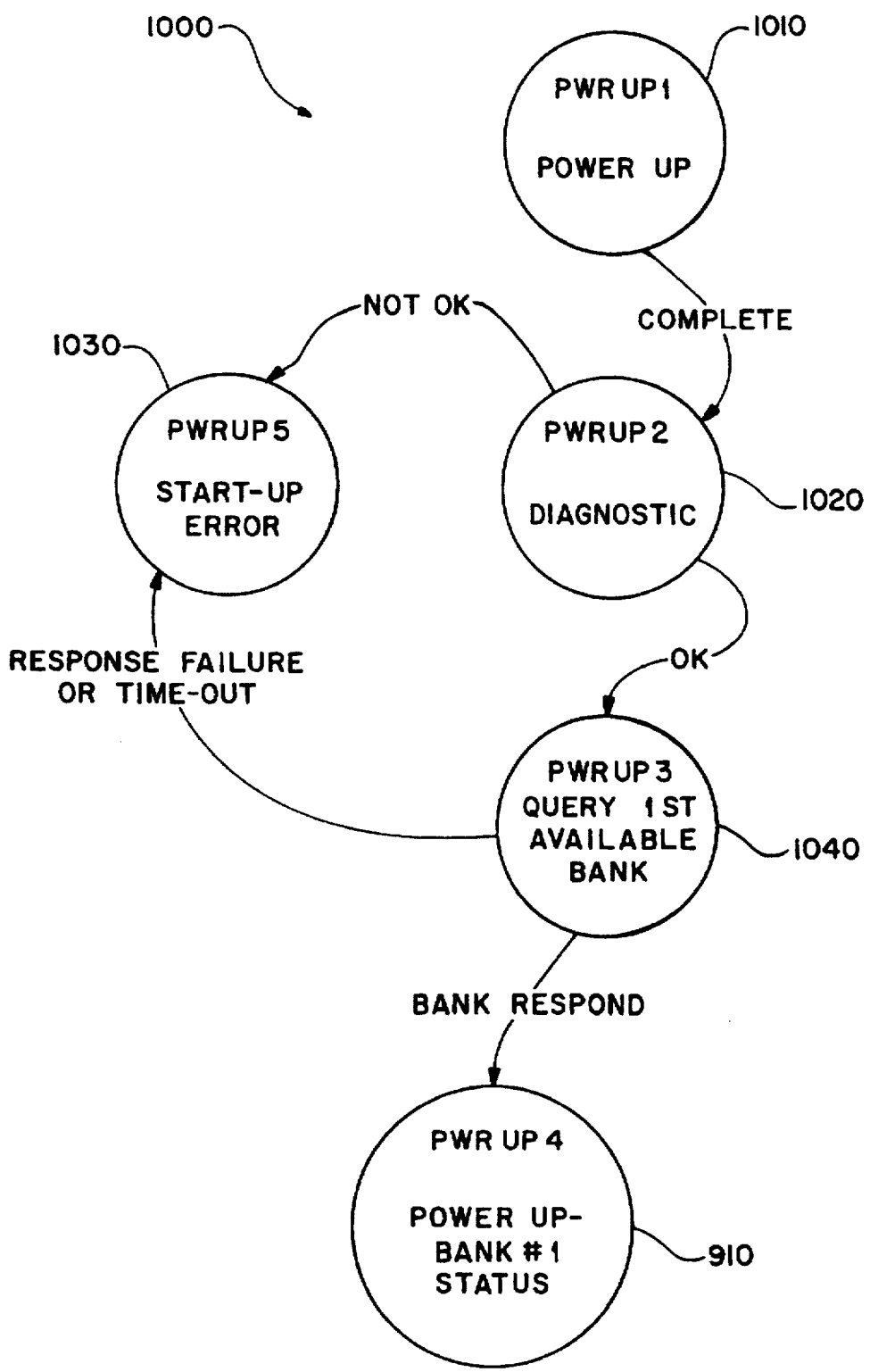

Referring now to FIG. 10, there is shown a power-up state diagram 1000. The remote control unit 50 is initially powered up at block 1010, and when complete, enters a diagnostic test stage at block 1020. If the diagnostic test performed at block 1020 indicates an error, a start up error is indicated at block 1030. Should the diagnostic test indicate that the remote control unit 50 is functioning properly, the remote control unit 50 will interrogate the first available bank at block 1040. In the event that a response failure or a time-out failure is experienced, a start up error will be indicated at 1030.

Where a response is received from a bank as a result of the query at block 1040, the status of the bank is displayed by the remote control unit 50 at block 910.

Figure 11:
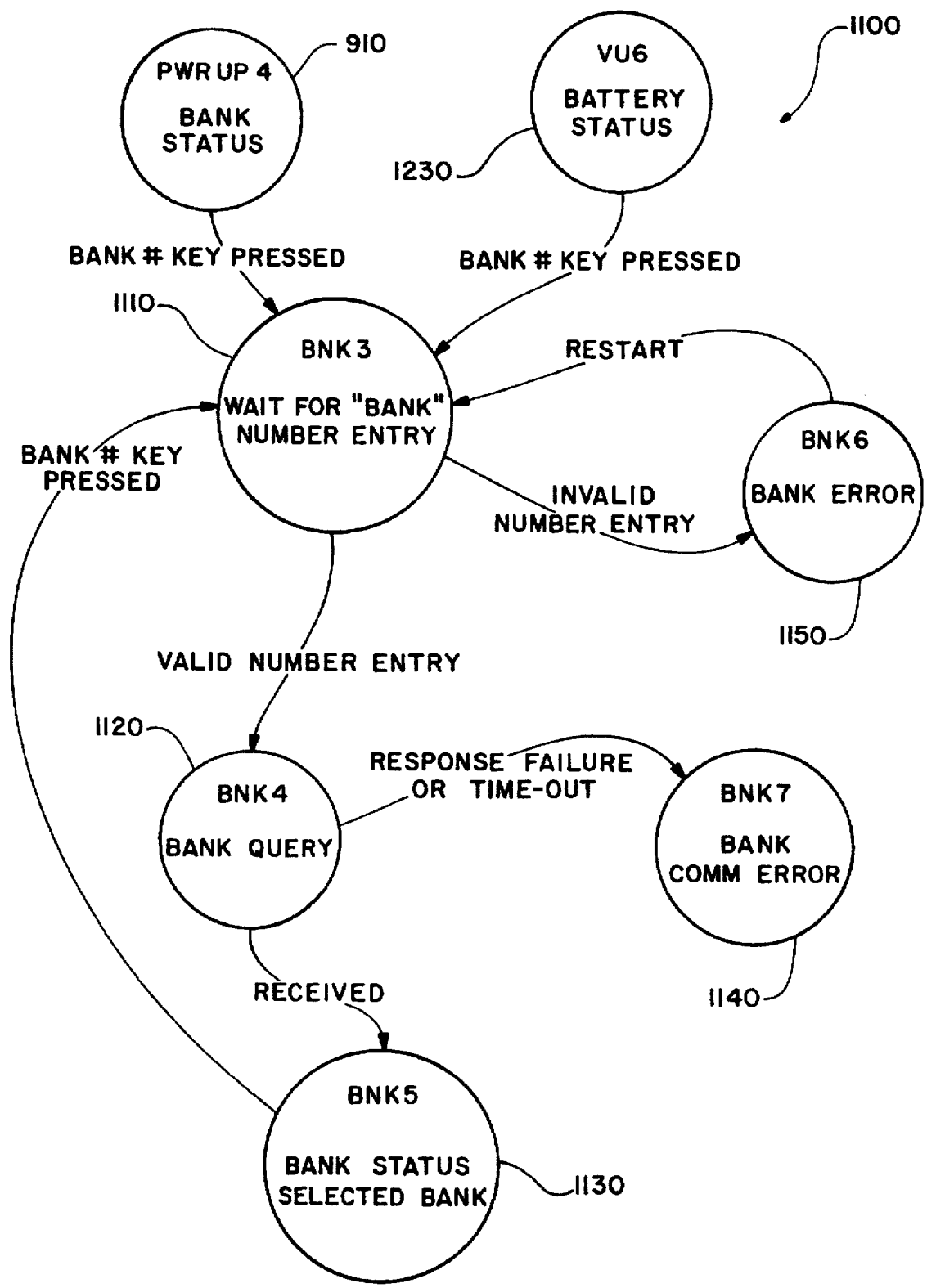

Referring now to FIG. 11, there is shown a bank state diagram 1100. From the power up bank status block 910 (FIG. 10), depressing the view bank key 570 (FIG. 6) causes the remote control unit 50 to wait for the entry of a desired main unit or bank number at block 1010. Similarly, from a battery status block 1230, the depression of the view bank key 570 results in the remote control unit 50 waiting for the entry of a desired bank number entry at block 1110. The desired number is entered by depressing one of the keys of the keypad 560, such as key 576, 578 or 580 (FIG. 6). If the number entered is invalid, a bank number error is indicated at block 1150 and a new number entry is requested at block 1110.

Upon the entry of a valid number, the selected bank is interrogated at block 1120. Should the selected bank fail to respond, or if a time-out error occurs, a bank communication error is indicated at block 1140. Where an appropriate response to the bank interrogation of block 1120 is received, the bank status from the selected bank is displayed at the remote control unit 50 at block 1130.

Additional banks may be selected by depressing the view bank key 570 again, wherein the entry of a new number is awaited at block 1110.

Figure 12:
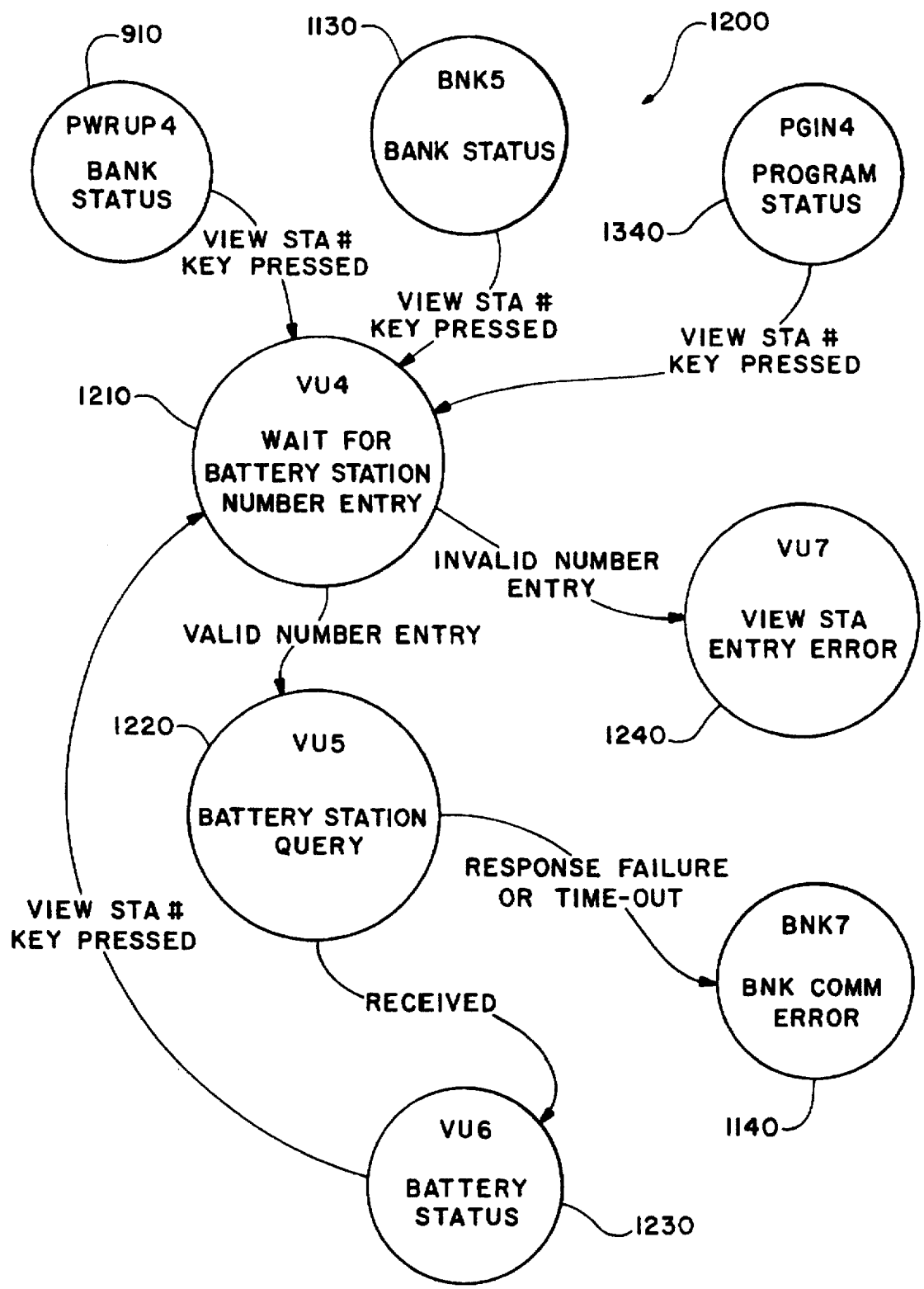

Referring now to FIG. 12, there is shown a view station state diagram 1200. The view station function may be initiated from the power up status block 910 or the bank status block 1130. Depressing the view station key 572 while at either the bank status block 910 or the bank status block 1130 causes the remote control unit 50 to wait for a station number to be entered at block 1210. Similarly, the view station function may be initiated from a program status block 1340 by depressing the view station key 572, wherein the entry of a desired battery selection number is awaited at block 1210.

The selection of an invalid number from the keypad 560 causes an entry error indication at block 1240. Upon the entry of a valid number, the selected battery station is interrogated at block 1220. Where the selected battery station fails to respond, or does not respond in a predetermined amount of time, a bank communication error is indicated at block 1140. When the selected battery station responds to the interrogation of block 1220, the selected battery station status is displayed at block 1230 to return to the block 1210. Additional battery stations may be selected by depressing the view station key 572 from the battery status block 1230.

Figure 13:
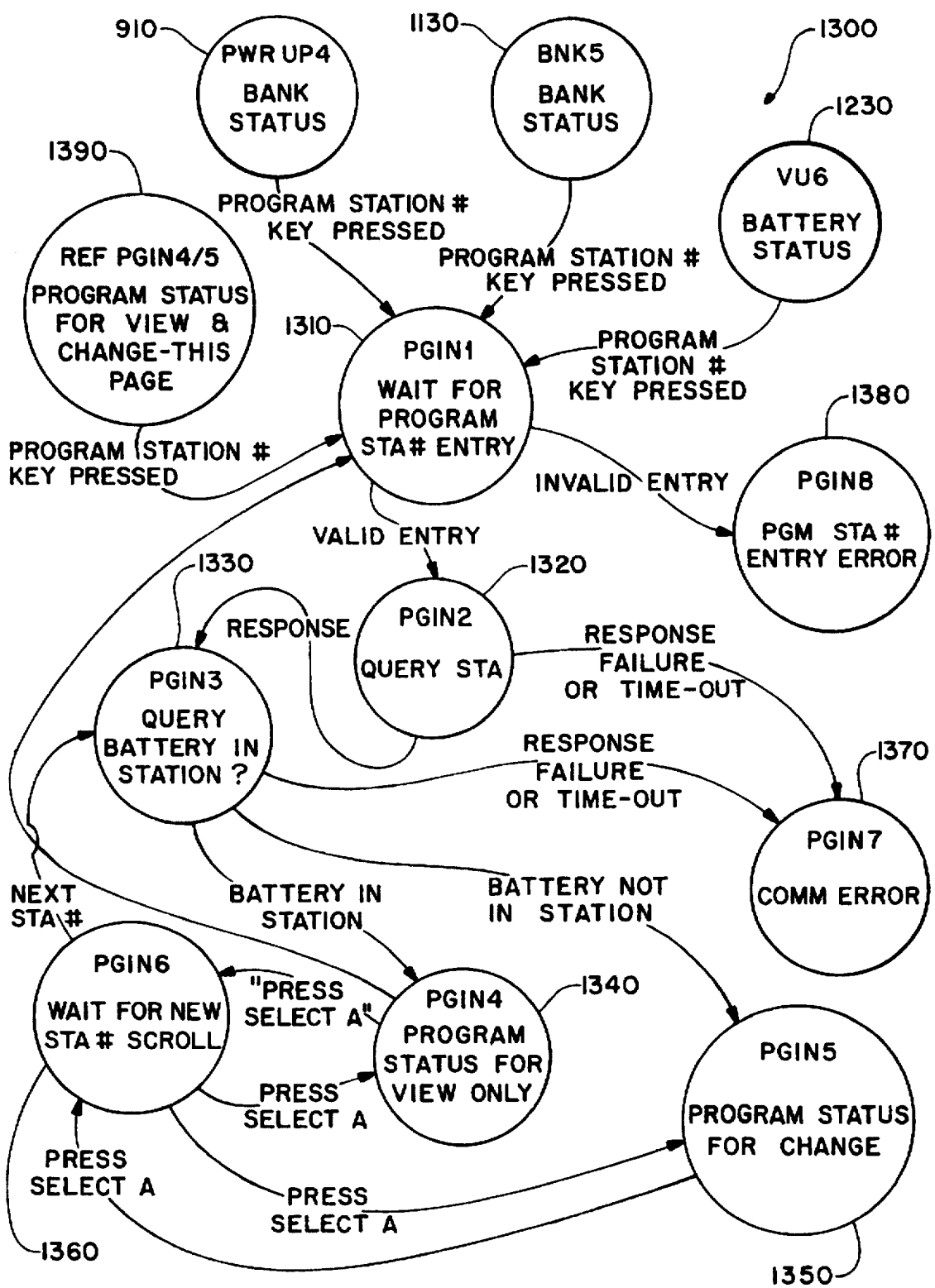

Referring now to FIG. 13, there is shown a program initialize state diagram 1300. The program initialize function can be initiated from the bank status block 910, the bank status block 1130, or the battery status block 1230. From blocks 910, 1130 and 1230, the program initialize function is initiated by depressing the program station key 574 (FIG. 6).

Depressing the program station key 574 from blocks 910, 1130 and 1230 permits the entry of a station number at block 1310. Similarly, the program initialization function can be initiated from a program status block 1390.

The entry of an invalid number at block 1310 results in a program station number entry error being indicated at block 1380. The entry of a valid station number causes the station to be interrogated at block 1320.

Where the battery station interrogated at block 1320 fails to properly respond within a predetermined period of time, a communication error is indicated at block 1370. A proper response to the interrogation at block 1320 results in an interrogation being initiated at block 1330 to determine if a battery has been detected or installed in the selected station. Where no response to the interrogation of block 1330 is received within a predetermined amount of time, a communication error is indicated at block 1370.

Where the interrogation performed at block 1330 indicates that there is a battery in the selected station, the program status for the station is viewed at block 1340. Where it is determined at block 1330 that a battery is in the selected station, that station may not be programmed and only the programmed parameters previously set may be viewed. A different battery station number may be selected from block 1340 for viewing by depressing the select A key 552 (FIG. 6) until the desired battery station number is displayed at block 1360. The program status may be viewed for the newly selected battery station at block 1340 by depressing the select A key 562 again.

If the interrogation performed at block 1330 indicates that a battery is not engaged with the selected battery station, a program status state is entered at block 1350, wherein the parameters for the selected station may be changed. By depressing the select A key 562, a new battery station number may be selected at block 1360.

Additional battery stations may be selected for viewing or changing from block 1360 by entering the new numbers of the desired battery stations, wherein the program initialize function returns to block 1330 for interrogating the desired battery stations.

Figure 14:
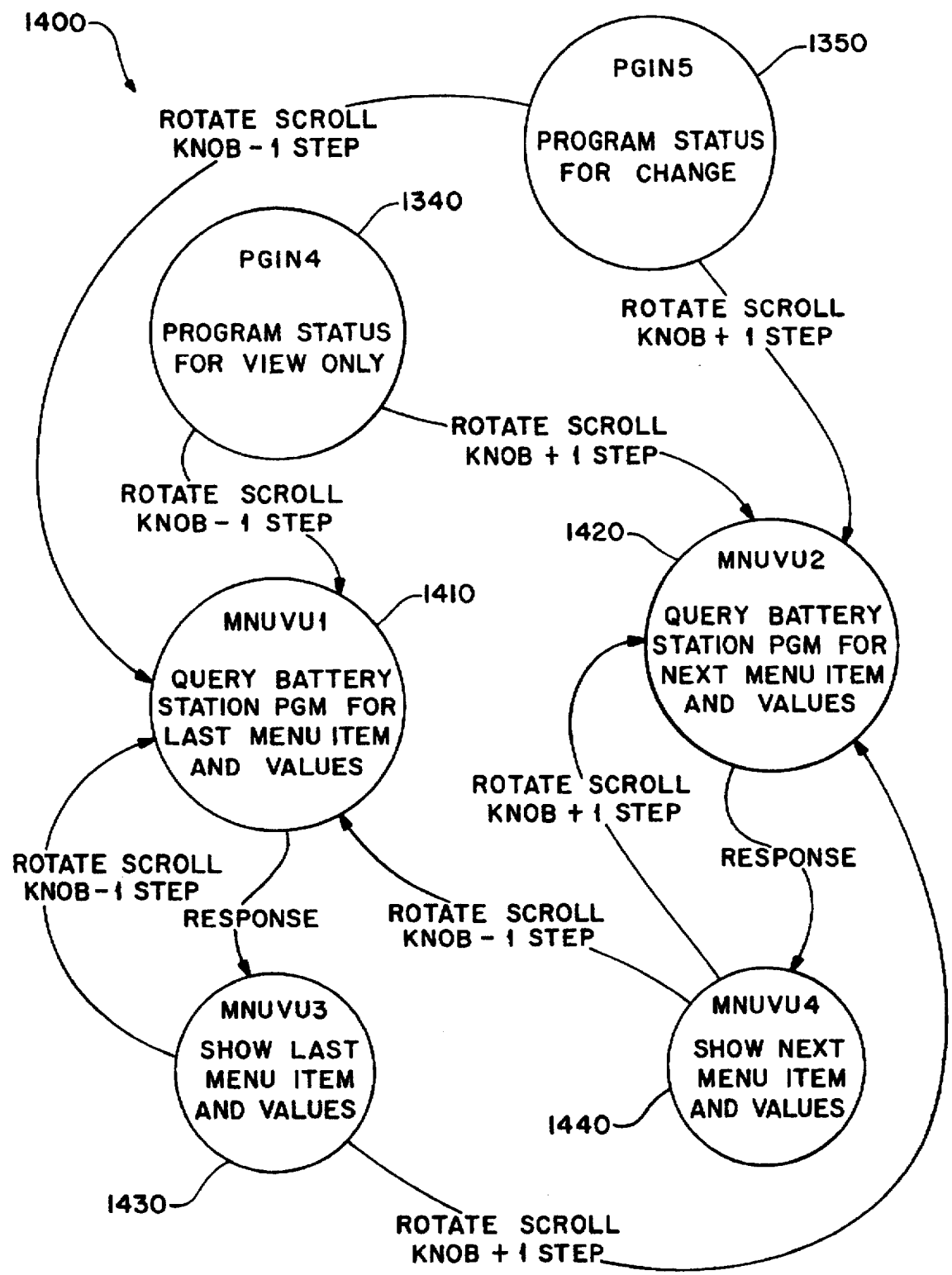

Referring now to FIG. 14, there is shown a program menu view state diagram 1400. The program menu view function may be initiated from the view only program status block 1340 by rotating the knob 592 (FIG. 6) to decrement the rotary encoder 591 (FIG. 5) wherein the last menu item and values for the battery station presently being interrogated is displayed at block 1410. Alternatively, the knob 592 may be rotated to increment the rotary encoder 591 to enable new menu items and values for the battery station being interrogated are displayed at block 1420.

The rotary knob 592 may also be used to display the last menu item in values for the presently interrogated battery station at block 1410 and the next menu items and values for the battery station at block 1420 from the program status block 1350.

A response to the interrogation of block 1410 enables the last menu items and values to be displayed at block 1430. From block 1430, the previous menu item and values may be displayed by decrementing the rotary encoder 591, or the next menu item and values may be selected at block 1420 by incrementing the rotary encoder 591.

The receipt of a response to the interrogation of block 1420 enables the next menu item and values to be displayed at block 1440. Decrementing the rotary encoder 591 enables the previous menu item and values for the present battery station to be interrogated at block 1410. Incrementing the rotary encoder 591 from block 1440 enables the next menu item and values for the selected battery station to be selected at block 1420.

Figure 15:
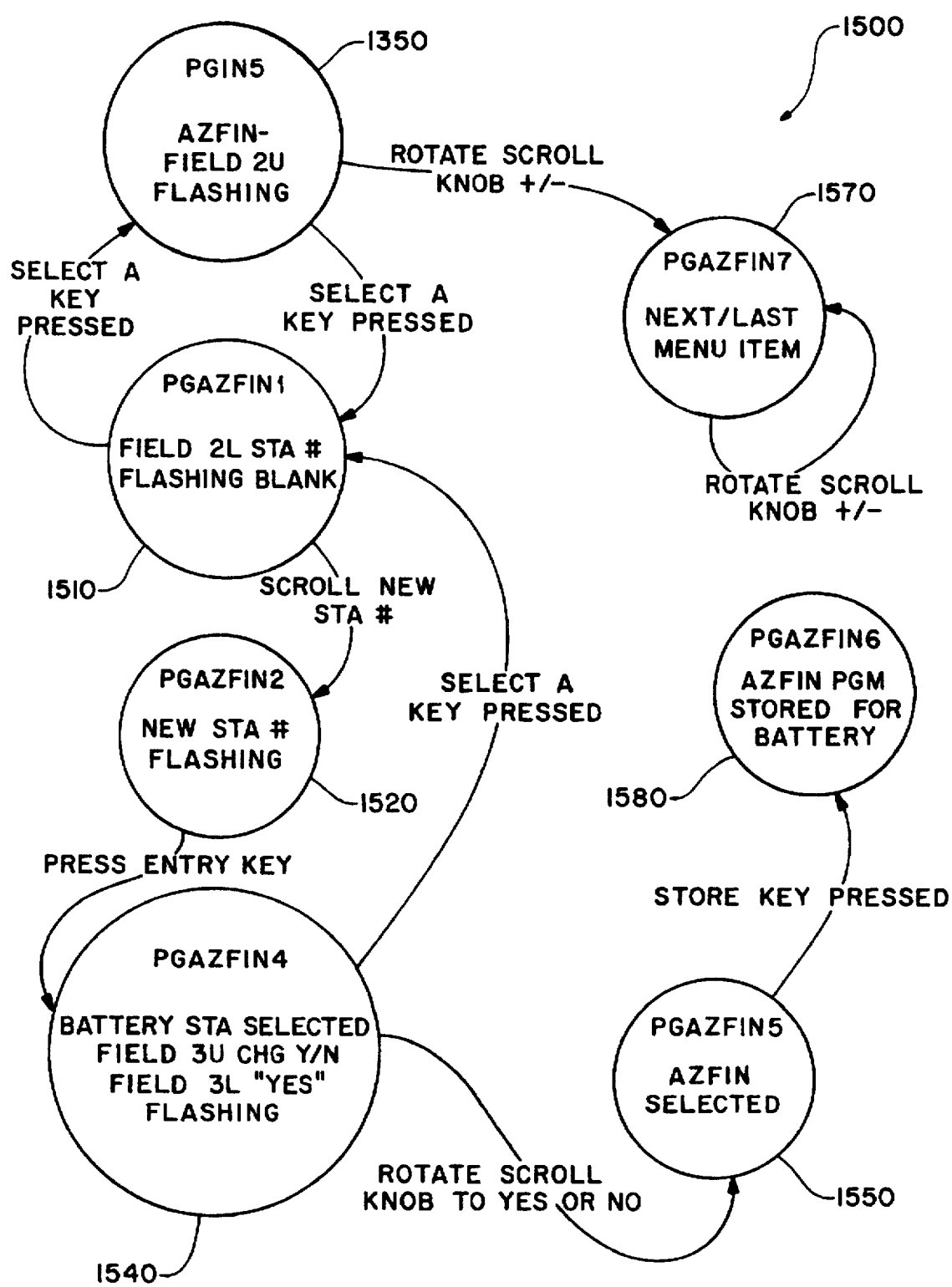

Referring now to FIG. 15, there is shown a program analyze finish state diagram 1500. The program analyze finish function is initiated at the program status block 1350. From the block 1350, the rotary encoder 591 (FIG. 5) may be incremented or decremented to select the next or previous menu items at block 1570. At the program status block 1350, the upper field 540 (FIG. 6) is caused to flash. Depressing the select A key 562 (FIG. 6) causes the field 540 to display the presently interrogated battery station at block 1510. Depressing the select A key 562 again causes the field 540 to flash at block 1350.

To select a new battery station number from block 1510, the rotary knob 592 is rotated to display a new station number at field 542 at block 1520. The enter key 582 is depressed when the selected battery station is presented for review at block 1540, and is displayed at field 546 and 548. A new battery station number may be selected from block 1540 by depressing the select A key 562 and returning to block 1510.

Where the battery station displayed in field 542 is to be adjusted, the knob 592 is rotated to cause block 548 to display either 'yes' or 'no,' indicating if the function indicated in display 546 is to be adjusted. The desired functions are selected at block 1550. Depressing the store key 584 enables the selected parameters to be stored at block 1580.

Figure 16:
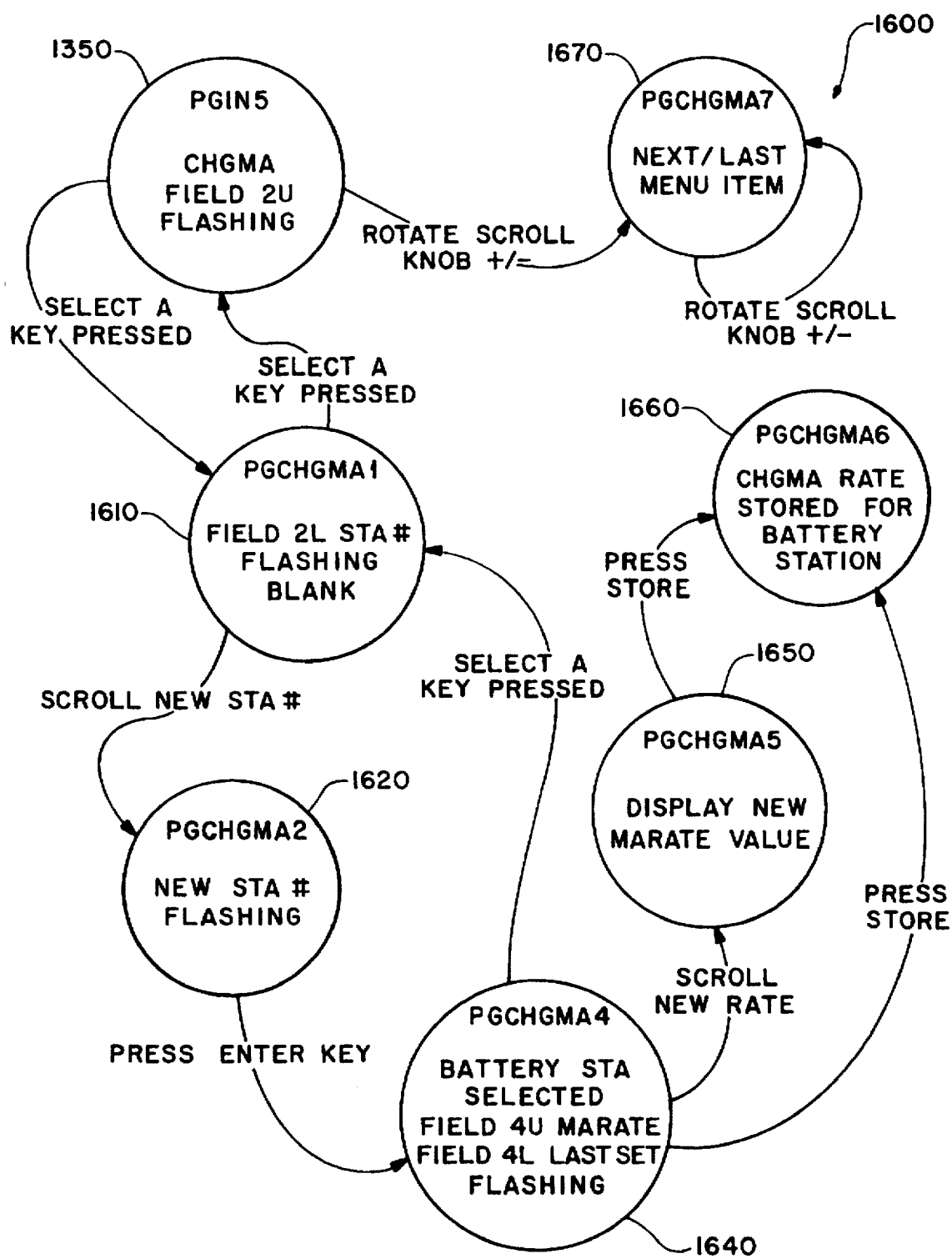

Referring now to FIG. 16, there is shown a program charge mA rate state diagram 1600. The program change function is initiated from the program status block 1350, wherein a menu item is displayed in upper field 540 (FIG. 6) in a flashing mode. Rotating the scroll knob 592 enables the next or previous menu item to be displayed at block 1670. Continuing to rotate the scroll knob 592 permits additional menu items to be viewed at block 1670.

To select a new menu item, the select A key 562 (FIG. 6) is depressed, wherein the present battery station number is displayed in lower field 542 at block 1610. To select a new menu item, the select A key 562 is depressed again to return control to the program status block 1350.

To select a different battery station number from the block 1610, the rotary scroll knob 592 is rotated to display a new battery station number at block 1620. Depressing the enter key 582 selects the battery displayed at block 1620 and causes the desired charge mA rate to be displayed at block 1640. In this regard, mA rate mode is indicated in field 552 while the most recent value for the mA rate is displayed in field 554. Depressing the select A key 562 at the block 1640 enables a new battery station to be selected at the block 1610.

To select the mA rate displayed in field 554 at block 1640, the store key 584 is depressed, wherein the new mA rate is stored at block 1660. To select a different mA rate than what is displayed in the field 554 at block 1640, the rotary scroll knob 592 is rotated to display a new mA rate value in the field 554 at the block 1650. The new mA rate value is selected by pressing the store key 584 to store the selected mA rate for the desired battery stations at block 1660.

Figure 17:
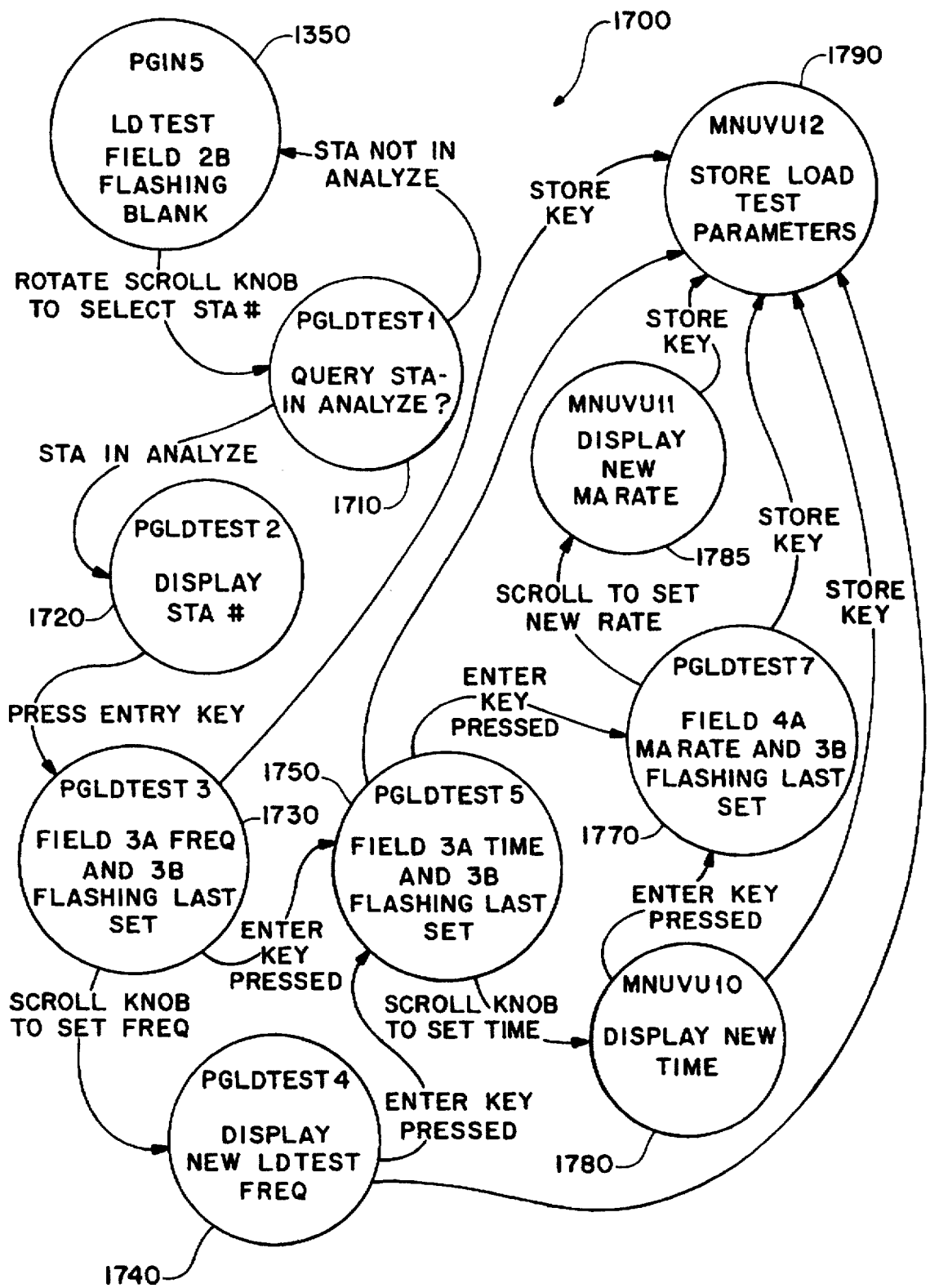

Referring now to FIG. 17, there is shown a load test state diagram 1700. The load test function is initiated at the program status block 1350. In this regard, the battery station which is to undergo the load test function is selected from the block 1350 by rotating the scroll knob 592, wherein the selected battery station is displayed in the field 542. The selected battery station is interrogated at block 1710 to determine if the battery station is in an analyze mode. Where the selected battery station is not in the analyze mode, a new battery station must be selected at block 1350.

Where it is determined at block 1710 that the selected battery station is in the analyze mode, the selected battery station is displayed at block 1720. Depressing the enter key 582 recalls the previous frequency setting for that station at block 1730. The previously set frequency setting is displayed in display field 548 of the display 530. If all of the load test information is as desired, the store key 594 is depressed to store the load test parameters at block 1790.

A new load test frequency may be selected by rotating the scroll knob 592, wherein a new load test frequency is displayed at block 1740. Depressing the store key 584 results in the new load test frequency being stored as a load test parameter at block 1790.

Where it is desired to adjust the duration of discharge parameter for the load test function, the enter key 582 may be depressed to select either the previous frequency parameters displayed at block 1730 or the newly displayed frequency parameters displayed at block 1740. Should the previous discharge time displayed at block 1750 and the selected frequency from either block 1730 or block 1740 be desired, the store key 584 may be depressed to store the frequency and discharge time and load test parameters at block 1790. A new discharge time parameter may be selected at block 1780 by rotating the scroll knob 592 prior to pressing the store key 592 to store the new discharge time parameter displayed at block 1780 as a load test parameter at block 1790.

The mA rate may also be adjusted at block 1770 utilizing either the previous discharge time from block 1750 or the newly selected discharge time from block 1780. Block 1770 causes the previous selected mA rate to be displayed. The previous mA rate and the newly selected frequency parameters from either block 1730 or 1740 as well as the newly selected discharge time parameter from block 1750 or block 1780 may be stored as load test parameters from block 1770 by depressing the store key 592. A new mA rate may be selected at block 1785 by rotating the scroll knob 592 prior to storing the new mA rate and the selected frequency and discharge time parameters at block 1790.

Figure 18:
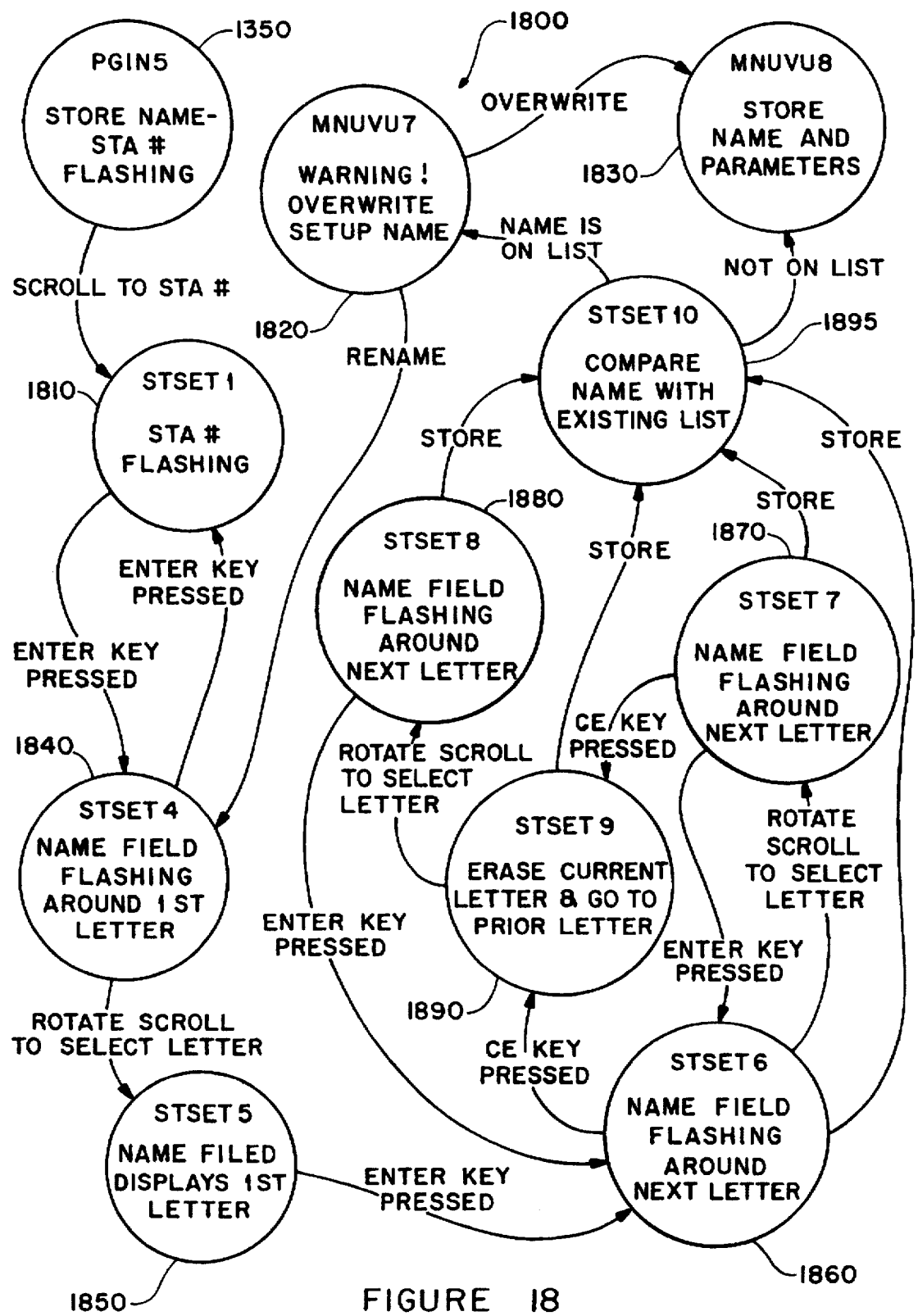

Referring now to FIG. 18, there is shown a store station set up state diagram 1800. The store station set up function is initiated at the program status block 1350, wherein a battery station number is displayed. A rotary scroll knob 592 is rotated to select the desired battery station at block 1810. The battery station displayed at block 1810 is selected by depressing the enter key 582 to cause the name field to be displayed at the block 1840, wherein the user is prompted to enter the first letter of an identifying name at block 1840. By rotating the scroll knob 592, a letter may be selected for the first letter of the identifying desired name. The selected first letter is displayed at block 1850 and depressing the enter key 582 enables the next letter to be selected at block 1860. The selected letters from blocks 1850 and 1860 may be compared with an existing name at block 1895 by depressing the store key 584.

To select an additional letter for the desired name from block 1860, the scroll knob 592 is rotated to display a new letter at block 1870. The newly selected letter at block 1870 as well as the selected letters from blocks 1850 and 1860 cam be compared with existing names at block 1895 by depressing the store key 584 at this point.

Additional letters can be selected by depressing the enter key 582 at block 1870 to enable yet another letter to be selected at block 1860. If it is determined at block 1870 that a mistake has been made in selecting a previous letter, the clear key 581 (FIG. 6) may be depressed to erase the current letter and return to the selection process for the previous letter at block 1890. Similarly, the letter selected at block 1860 can be erased to permit the first letter displayed at block 1850 to be changed by depressing the clear key 581 at block 1860, wherein the letter displayed at block 1860 is erased and the first letter is displayed at block 1890.

The revised letter displayed at block 1890 may be compared with existing names at block 1895 by depressing the store key 584. To select a new letter before comparing at block 1895, the scroll knob 592 may be rotated to select a new letter, wherein a prompt for the next letter is displayed at block 1880. Another letter may be selected by depressing the enter key 582, wherein a prompt for the next letter is displayed at block 1860.

The letters displayed at block 1880 may be compared with existing names at block 1895 by depressing the store key 584. Where the comparison performed at block 1895 indicates that the selected name has not been stored previously, the newly selected name is stored together with the associated parameters at block 1830. However, should the comparison at block 1895 indicate that the selected name has been previously stored, a warning is indicated at block 1820. At this point, a new name may be selected by returning to block 1840, or the new name may be used to override the previous name, wherein the new name and its associated parameters are stored at block 1830.

Figure 19:
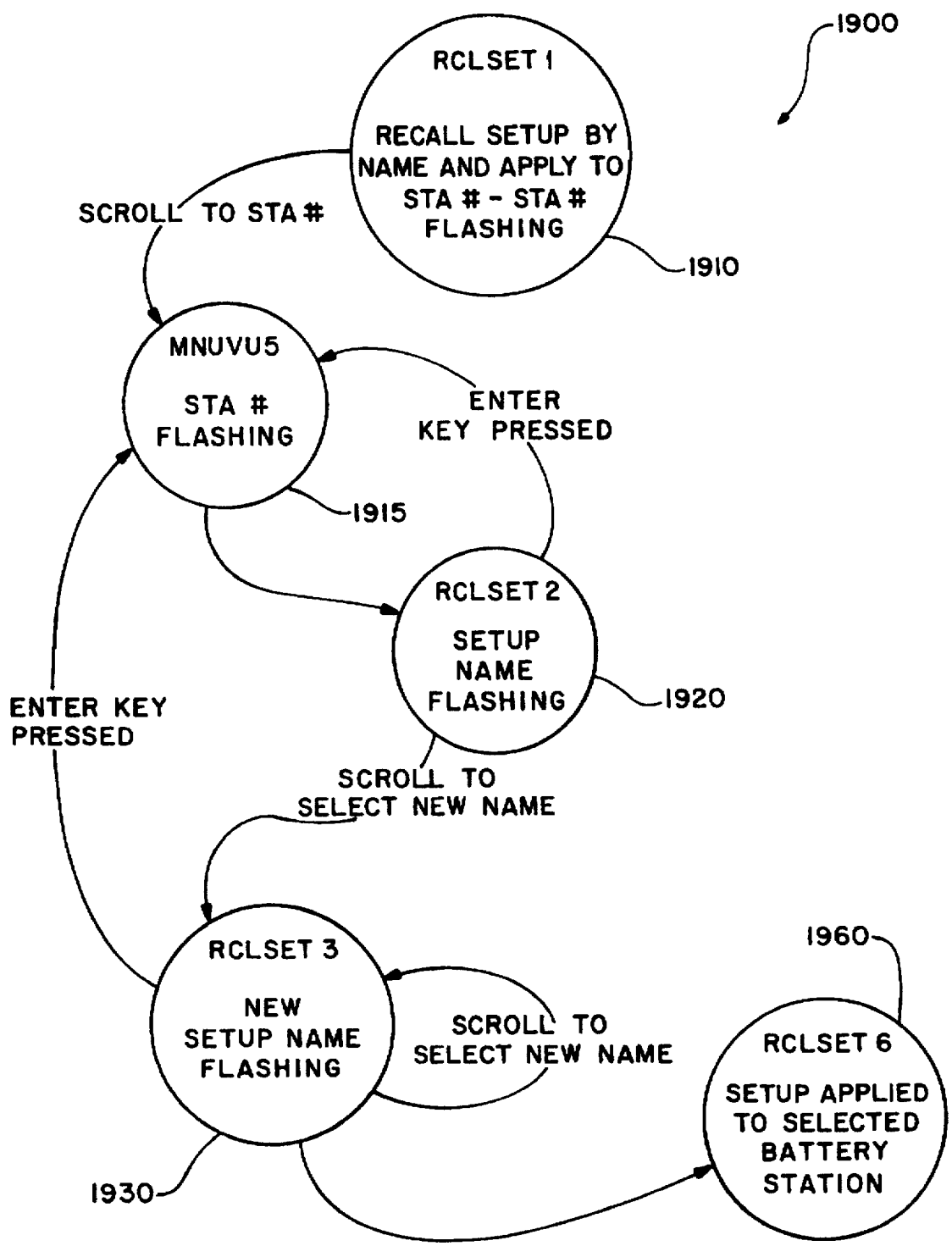

Referring now to FIG. 19, there is shown a recall set up state diagram 1900. The recall set up function is initiated at block 1910. A selected station number is displayed at block 1915 by rotating the scroll knob 592 until the desired battery station number is displayed at block 1915. A set up name is displayed at block 1920 for use with the selected battery station number at block 1915. If the displayed set up name at block 1920 is desired to be used with the battery station number displayed at block 1915, the enter key 582 is depressed. However, if a different set up name is desired for use with the station number displayed at block 1915, the scroll knob is rotated to display a new set up name at block 1930.

The scroll knob 592 can be rotated again at block 1930 to select a new set up name which is displayed at block 1930. Once the desired set up name is displayed at block 1930 for the selected battery station number at block 1915, the enter key 582 is depressed. A new battery station number is then selected at block 1915 and the previously described process is repeated until a desired set up name has been selected for all battery station numbers at block 1960.

Figure 20:
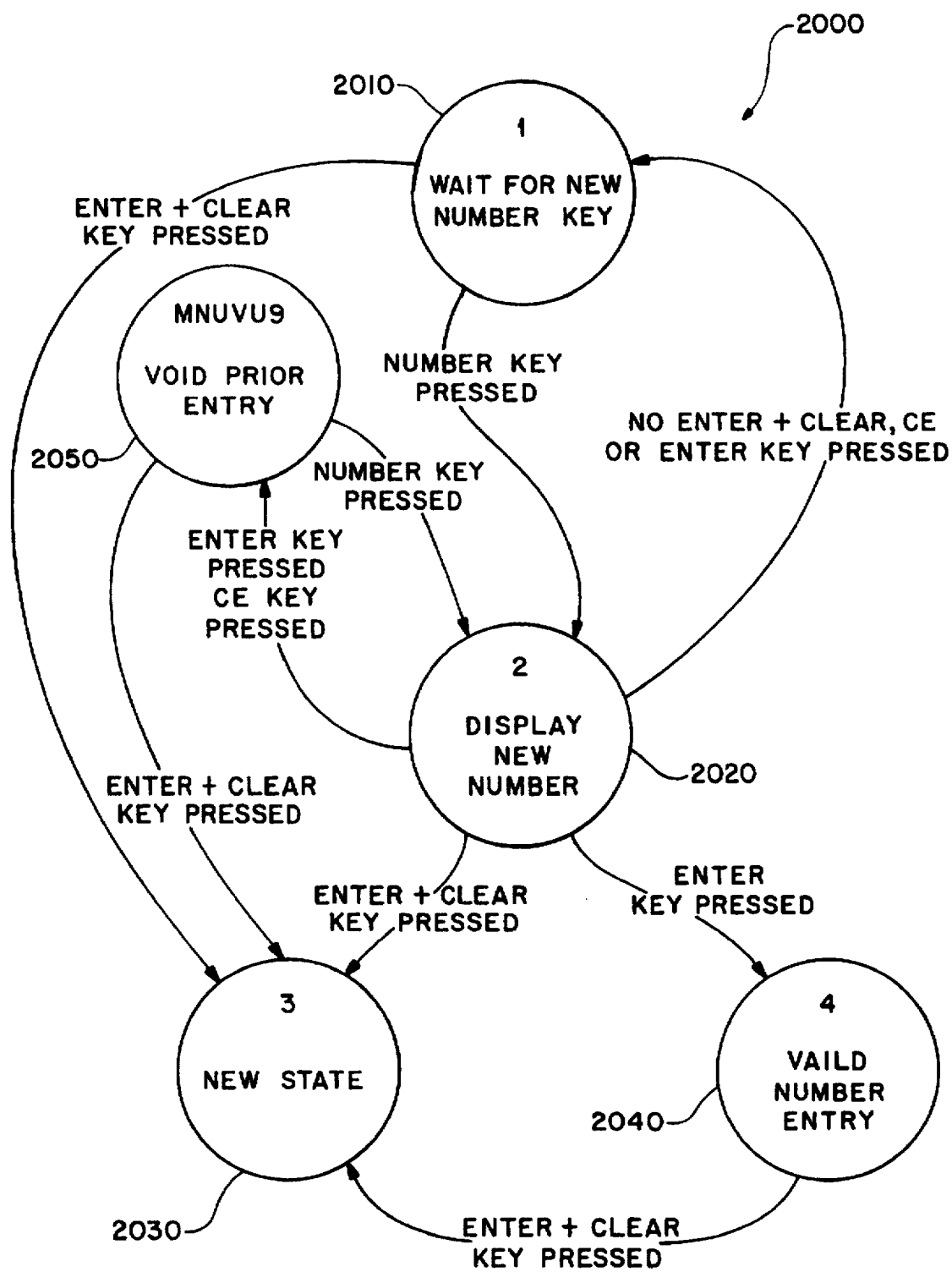

Referring now to FIG. 20, there is shown a valid number entry state diagram 2000. The valid number entry function is initiated at block 2010. Depressing a number key, such as number keys 576, 578 and 580, enables the selected number to be displayed at block 2020. If the number displayed at block 2020 is the number desired, the enter key 582 is depressed to enter a valid number at block 2040. Failing to enter a command after the selected number is displayed at block 2020 returns the function to the wait status at block 2010.

Where the newly displayed number at block 2020 is not desired, the clear key 581 is depressed to void the number at block 2050. A new number can be entered from block 2050 by depressing one of the number keys, such as key 576, 578 or 580, to display a selected number at block 2020.

A new state may be achieved at block 2030 from blocks 2010, 2020, 2040 or 2050 by depressing the enter key 582 and the clear key 581 simultaneously.

While particular embodiments of the present invention have been disclosed, it is to be understood that various different modifications are possible and are contemplated within the true spirit and scope of the appended claims. For example, while main units 30, 40 and 45 are shown and described as being connected to the buss 20, it should be understood that such main units can, in general, be used for power systems management. Other devices may also be connected to the buss 20 for power systems management purposes including, but not limited to, battery monitors, battery sensors or other such devices. Also, the remote control unit 50 could operate as an analyzer/conditioner in a similar manner as main units 30, 40 and 45. The remote control unit 50 is described as being geographically remotely located, however, the term remote is used to indicate that the remote control unit 50 is separated from the other components of the system 10, and could include any distance. Furthermore, the main units 30, 40 and 45 may also be used to determine the condition of a battery. While the analyzing function is performed by the main units and, if desired, by the remote unit, they can, in general, perform diagnosis functions, including, but not limited to, analyzing and quality checking. Similarly, while the conditioning function is disclosed, the units can be capable of all repair functions, including, but not limited to, conditioning, rejuvenating, restoring and others. Likewise, the units can also be used for manufacturing functions, including, but not limited to, forming, pre-final assembly testing, and others. There is no intention, therefore, of limitations to the exact abstract or disclosure herein presented.

What is claimed is:

1. A battery management system for use with rechargeable batteries, comprising:

power systems management means for enabling a group of the batteries to be managed for determining the performance characteristics of the batteries in said group, and for enabling the batteries in said group to be diagnosed, repaired, and manufactured;

wherein said management means stores selectable management parameters for each one of the batteries in said group, and further controls the diagnosing, repairing, and manufacturing of each one of the batteries in said group according to said parameters to facilitate the management of the batteries;

wherein said management means generates source command signals for enabling each one of the batteries in said group to be diagnosed, repaired, and manufactured, and further generates source information signals indicative of the charge state of each one of the batteries in said group and indicative of said parameters;

buss means coupled to said management means for facilitating the remote control of said management means; and control unit means coupled to said buss means for generating remote command signals to cause said management means to generate said source command signals in response to said remote command signals for controlling remotely the operation of said management means, and for generating remote information signals indicative of the state of the batteries in response to said source information signals.

2. A battery management system according to claim 1, wherein said management means further generates remote selection signals to facilitate the selection of said parameters.

3. A battery management system according to claim 2, wherein said control unit means includes a port means for coupling said buss means to said control unit means to enable it to transmit said remote command signals and to receive said source information signals.

4. A battery management system according to claim 3, wherein said management means further includes an input port means for coupling said buss means to said management means to enable it to transmit said source information signals and to receive said remote command signals.

5. A battery management system according to claim 4, further including another power systems management means for analyzing and conditioning another group of the batteries, said another management means for storing additional selectable management parameters for each one of the batteries in said another group;

wherein said another management means generates another source command signal for enabling each one of the batteries in said another group to be analyzed and conditioned, and said another management means further generates another source information signal indicative of the charge state of each one of the batteries in said another group and indicative of said additional parameters; and another buss means for coupling said another management means to the first-mentioned management means for controlling remotely the operation of the first mentioned and said another management means.

6. A battery management system according to claim 5, wherein said another management means further includes another input port means for facilitating the communication of said remote command signal and said another source information signal;

the first-mentioned management means further includes an output port means for enabling said another management means to communicate with the first mentioned management means.

7. A battery management system according to claim 6, wherein the first mentioned management means further includes a printer port means for exporting said source information signal and said another source information signal to enable said signals to be reproduced in a printed form.

8. A system according to claim 1, wherein said power systems management means includes a battery management unit.

9. A battery management system for use with rechargeable batteries, comprising:

a plurality of power systems management units each having a control input port and a control output port, each one of said management units for analyzing and conditioning a plurality of rechargeable batteries;

network cable means interconnecting in communication the control input of one management unit with control output of another management unit to provide a daisy chain network;

remote control means for sending control commands to individual ones of the management units to cause them to analyze/condition individual ones of the batteries connected thereto; and remote control cable means interconnecting an output port of said remote control means to the input port of an initial one of said management units to facilitate the sending of information from said remote control means to individual ones of said management units.

10. A system according to claim 9, wherein said remote control means further includes a display so that information from individual ones of the management units regarding individual batteries can be displayed.

11. A system according to claim 9, wherein said cable means includes a plurality of lines for providing two-way communication.

12. A system according to claim 11, wherein said lines comprise nine individual lines.

13. A system according to claim 9, wherein an adjacent one of said management units includes means for supplying activating power to said remote control means via said cable means for powering it.

14. A system according to claim 9, wherein each one of the management units includes a computer processing unit.

15. A system according to claim 9, wherein said remote control means includes a computer processing unit.

16. A system according to claim 9, wherein each one of said management units includes bar code reader means for providing additional information for the system.

17. A system according to claim 9, wherein said remote control means sends protocol messages to each one of the management units via said cable means, and said individual management units communicating via said cable means with said remote control means with their protocol messages.

18. A system according to claim 9, further including supplying unit activating power from an adjacent one of the management units via said remote control cable means to said remote control means for powering it.

19. A system according to claim 9, wherein said power systems management units include a battery management unit.

20. A method of using a battery management system for rechargeable batteries, comprising:

using a plurality of power systems management units each having a control input and a control output, each one of said management units for analyzing and conditioning a plurality of rechargeable batteries;

interconnecting in communication the control input of one management unit with control output of another management unit with cable means to provide a daisy chain network;

sending control commands from a remote control means to individual ones of the management units to cause them to analyze/condition individual ones of the batteries connected thereto; and interconnecting an output of said remote control means to the input of an initial one of said management units to facilitate the sending of information from said remote control means to individual ones of said management units.

21. A method according to claim 20, further including displaying at said remote control means information from individual ones of the management units regarding individual batteries can be displayed.

22. A system according to claim 20, further including providing two-way communication over said cable means.

* * * * *